United States Patent
Grimaldi et al.

(10) Patent No.: US 11,909,405 B1
(45) Date of Patent: Feb. 20, 2024

(54) DIGITAL COARSE LOCKING IN DIGITAL PHASE-LOCKED LOOPS

(71) Applicant: Infineon Technologies AG, Neubiberg (DE)

(72) Inventors: Luigi Grimaldi, Villach (AT); Thomas Bauernfeind, Arbing (AT); Dmytro Cherniak, Villach (AT); Fabio Versolatto, Villach (AT); Andrew Wightwick, Ledenitzen (AT); Fabio Padovan, Villach (AT); Giovanni Boi, Padua (IT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 18/151,861

(22) Filed: Jan. 9, 2023

(51) Int. Cl.
*H03L 7/093* (2006.01)
*H03L 7/18* (2006.01)
*H03L 7/099* (2006.01)

(52) U.S. Cl.
CPC .............. *H03L 7/093* (2013.01); *H03L 7/099* (2013.01); *H03L 7/18* (2013.01)

(58) Field of Classification Search
CPC ............ H03L 7/093; H03L 7/099; H03L 7/18
See application file for complete search history.

(56) References Cited

U.S. PATENT DOCUMENTS

| | | | |
|---|---|---|---|
| 6,292,051 B1 * | 9/2001 | Su ........................ | H04L 25/4902 329/313 |
| 6,833,875 B1 * | 12/2004 | Yang ...................... | H04N 5/208 348/505 |
| 2002/0160734 A1 * | 10/2002 | Li ......................... | H03G 3/3068 455/240.1 |
| 2003/0067898 A1 * | 4/2003 | Challa .................... | H04B 1/708 370/335 |
| 2004/0198257 A1 * | 10/2004 | Takano ................ | H03G 3/3047 455/108 |

(Continued)

OTHER PUBLICATIONS

Bertulessi et al., "A Low-Phase-Noise Digital Bang-Bang PLL with Fast Lock Over a Wide Lock Range," 2018 IEEE International Solid-State Circuits Conference, Digest of Technical Papers, Feb. 13, 2018, 3 pages.

(Continued)

*Primary Examiner* — Adam D Houston
(74) *Attorney, Agent, or Firm* — Slater Matsil, LLP

(57) ABSTRACT

A digital phase-locked loop (DPLL) circuit includes: a first time-to-digital converter (TDC) and a first digital loop filter (DLF) that are configured to be coupled between a reference clock source and a digitally controlled oscillator (DCO), where the first TDC is configured to, during an acquisition mode, generate a phase error by: receiving a reference clock signal from the reference clock source; receiving a clock signal that is based on an output of the DCO divided by a dividing factor, computing a phase error using the reference clock signal and the clock signal; detecting cycle slipping in the computed phase error; and in response to detecting the cycle slipping, modifying the computed phase error to reduce the impact of cycle slipping on the DPLL circuit; and a first frequency divider circuit configured to generate the clock signal by dividing the output of the DCO by the dividing factor.

20 Claims, 14 Drawing Sheets

(56) References Cited

U.S. PATENT DOCUMENTS

| | | | | |
|---|---|---|---|---|
| 2007/0085579 A1* | 4/2007 | Wallberg | ............. | H03L 7/08 375/376 |
| 2008/0129388 A1* | 6/2008 | Gonzalez | ............. | H03L 7/18 331/10 |
| 2010/0188158 A1* | 7/2010 | Ainspan | ............. | H03L 7/099 331/1 A |
| 2011/0050301 A1* | 3/2011 | Perrott | ............. | H03L 7/089 327/156 |
| 2013/0147531 A1* | 6/2013 | Lee | ............. | H03L 7/089 327/158 |
| 2014/0210532 A1* | 7/2014 | Jenkins | ............. | H03L 7/087 327/159 |
| 2016/0065223 A1* | 3/2016 | Galton | ............. | H03L 7/197 327/159 |
| 2016/0308541 A1* | 10/2016 | Liu | ............. | H03L 7/183 |
| 2018/0062660 A1* | 3/2018 | van den Heuvel | ..... | H03L 7/085 |
| 2019/0056698 A1* | 2/2019 | Testi | ............. | H03L 7/0997 |
| 2020/0127647 A1* | 4/2020 | Li | ............. | H03L 7/095 |
| 2020/0192301 A1* | 6/2020 | Khoury | ............. | H03L 7/085 |
| 2020/0195261 A1* | 6/2020 | Khoury | ............. | G06F 1/022 |
| 2020/0295765 A1* | 9/2020 | Agrawal | ............. | H03L 7/083 |
| 2023/0095364 A1* | 3/2023 | Sarda | ............. | H04L 7/0054 375/355 |
| 2023/0308104 A1* | 9/2023 | Nelson | ............. | G06F 1/12 375/376 |

OTHER PUBLICATIONS

Gao et al., "A 2.7-to-4.3GHz, 0.16psrms-Jitter,—246.8dB-FOM, Digital Fractional-N Sampling PLL in 28nm CMOS," 2016 IEEE International Solid-State Circuits Conference, Digest of Technical Papers, Feb. 2, 2016, 3 pages.

\* cited by examiner

| Current State | ref | div | diff | Next State | start_en | stop_en | out_en | sign |
|---|---|---|---|---|---|---|---|---|
| IDLE | 0 | 0 | don't care | IDLE | 1 | 1 | 0 | 0 |
| IDLE | 0 | 1 | don't care | DOWN | 0 | 1 | 0 | 0 |
| IDLE | 1 | 0 | don't care | UP | 0 | 1 | 0 | 0 |
| IDLE | 1 | 1 | don't care | IDLE | 1 | 1 | 1 | 0 |
| UP | 0 | 0 | <15 | UP | 0 | 1 | 0 | 0 |
| UP | 0 | 0 | =15 | UP | 0 | 0 | 1 | 0 |
| UP | 0 | 1 | don't care | IDLE | 0 | 1 | 0 | 0 |
| UP | 1 | 0 | <15 | UP | 0 | 0 | 1 | 0 |
| UP | 1 | 0 | =15 | UP | 0 | 1 | 1 | 0 |
| UP | 1 | 1 | <15 | UP | 0 | 0 | 1 | 0 |
| UP | 1 | 1 | =15 | UP | 0 | 0 | 1 | 0 |
| DOWN | 0 | 0 | <15 | DOWN | 0 | 1 | 0 | 1 |
| DOWN | 0 | 0 | =15 | DOWN | 0 | 0 | 1 | 1 |
| DOWN | 0 | 1 | <15 | DOWN | 0 | 1 | 0 | 1 |
| DOWN | 0 | 1 | =15 | DOWN | 0 | 0 | 1 | 1 |
| DOWN | 1 | 0 | don't care | IDLE | 0 | 0 | 1 | 1 |
| DOWN | 1 | 1 | <15 | DOWN | 0 | 1 | 1 | 1 |
| DOWN | 1 | 1 | =15 | DOWN | 0 | 0 | 1 | 1 |

Fig. 13

DIGITAL COARSE LOCKING IN DIGITAL PHASE-LOCKED LOOPS

TECHNICAL FIELD

The present invention relates generally to circuits, and in particular, digital phase-locked loop (DPLL) circuits.

BACKGROUND

Digital phase-locked loops (DPLLs) are widely used in modern electronics systems. For example, DPLLs (also referred to as DPLL circuits) are used to generate frequency signals used for transmitting and/or receiving digital data by electronic devices with communication capabilities. DPLLs may be used in mobile phones, digital TVs, modems, or radar systems.

During normal operation, the DPLL typically starts in an acquisition mode (may also be referred to as a locking mode) followed by a tracking mode. When the DPLL is started, the frequency of the frequency signal (e.g., a clock signal, or a sinusoidal signal) generated by a digitally controlled oscillator (DCO) of the DPLL may be far away from the target frequency (e.g., a user specified frequency). In the acquisition mode, the DPLL ideally should quickly achieve frequency lock to the target frequency, such that the frequency of the frequency signal generated by the DCO converges from an initial frequency to the target frequency. After achieving frequency lock, the DPLL switches into the tracking mode, and track the phase error between the frequency signal generated by the DCO and a reference signal. In the tracking mode, the DPLL functions to reduce or minimize the phase error and to maintain the frequency lock.

Data transmission/reception of electronic device is normally disabled during the acquisition mode of the DPLL, and is enabled after the DPLL achieves frequency lock and enters the tracking mode. Therefore, it is advantageous to reduce the duration of the acquisition mode, since the time and energy consumed during the acquisition mode are not contributing to the task of data transmission/reception. There is a need in the art for DPLL that can achieve quick frequency lock in the acquisition mode, such that the utilization rate of the electronic devices is improved and energy consumption is reduced.

SUMMARY

In accordance with an embodiment, a digital phase-locked loop (DPLL) circuit includes: a first time-to-digital converter (TDC) and a first digital loop filter (DLF) that are configured to be coupled between a reference clock source and a digitally controlled oscillator (DCO), wherein the first TDC is configured to, during an acquisition mode of the DPLL circuit, generate a phase error by: receiving a reference clock signal from the reference clock source; receiving a first clock signal that is based on an output of the DCO divided by a dividing factor; computing a phase error using the reference clock signal and the first clock signal; detecting cycle slipping in the computed phase error; and in response to detecting the cycle slipping, modifying the computed phase error to reduce the impact of cycle slipping on operation of the DPLL circuit; and a first frequency divider circuit coupled to the DCO, wherein the first frequency divider circuit is configured to generate the first clock signal by dividing the output of the DCO by the dividing factor.

In accordance with an embodiment, a digital phase-locked loop (DPLL) circuit includes: a coarse time-to-digital converter (TDC) and a coarse digital loop filter (DLF) that are configured to be coupled between a reference clock source and a digitally controlled oscillator (DCO), wherein the coarse TDC comprises: a first edge detection circuit configured to detect a first edge of a reference clock signal from the reference clock source; a second edge detection circuit configured to detect a second edge of a first clock signal, wherein the first clock signal is based on an output of the DCO divided by a dividing factor, wherein the second edge comprises a closest edge to the first edge; a counter configured to count the number of clock cycles of a second clock signal, wherein the second clock signal is the output of the DCO divided by a fixed dividing factor; a first register configured to latch a first output value of the counter at the first edge of the reference clock signal; a second register configured to latch a second output value of the counter at the second edge of the first clock signal; a subtractor circuit configured to compute a first difference between the second output value and the first output value of the counter; and a saturation circuit configured to detect cycle slipping between the reference clock signal and the first clock signal and configured to saturate the first difference to a pre-determined value when cycle slipping is detected. The DPLL circuit further includes a first frequency divider circuit coupled to the DCO, wherein the first frequency divider circuit is configured to generate the first clock signal by dividing the output of the DCO by the dividing factor; and a second frequency divider circuit coupled between the DCO and the coarse TDC, wherein the second frequency divider circuit is configured to generate the second clock signal by dividing the output of the DCO by the fixed dividing factor.

In accordance with an embodiment, a digital phase-locked loop (DPLL) circuit includes: a coarse time-to-digital converter (TDC) and a coarse digital loop filter (DLF) that are configured to be coupled between a reference clock source and a digitally controlled oscillator (DCO), wherein the coarse TDC is configured to, during an acquisition mode of the DPLL circuit, generate a phase error by: receiving a reference clock signal from the reference clock source; receiving a first clock signal that is based on an output of the DCO divided by a dividing factor; computing a phase error using the reference clock signal and the first clock signal; comparing a magnitude of the phase error with a threshold value; and in response to detecting that the magnitude of the phase error is equal to or larger than the threshold value, saturating the magnitude of the computed phase error to the threshold value. The DPLL circuit further includes a first frequency divider circuit coupled to the DCO, wherein the first frequency divider circuit is configured to generate the first clock signal by dividing the output of the DCO by the dividing factor.

BRIEF DESCRIPTION OF THE DRAWINGS

For a more complete understanding of the present invention, and the advantages thereof, reference is now made to the following descriptions taken in conjunction with the accompanying drawings, in which:

FIG. 13 illustrates the state transition table for the FSM of the coarse TDC of FIG. 10, in an embodiment.

DETAILED DESCRIPTION OF ILLUSTRATIVE EXAMPLES

Figure 1:
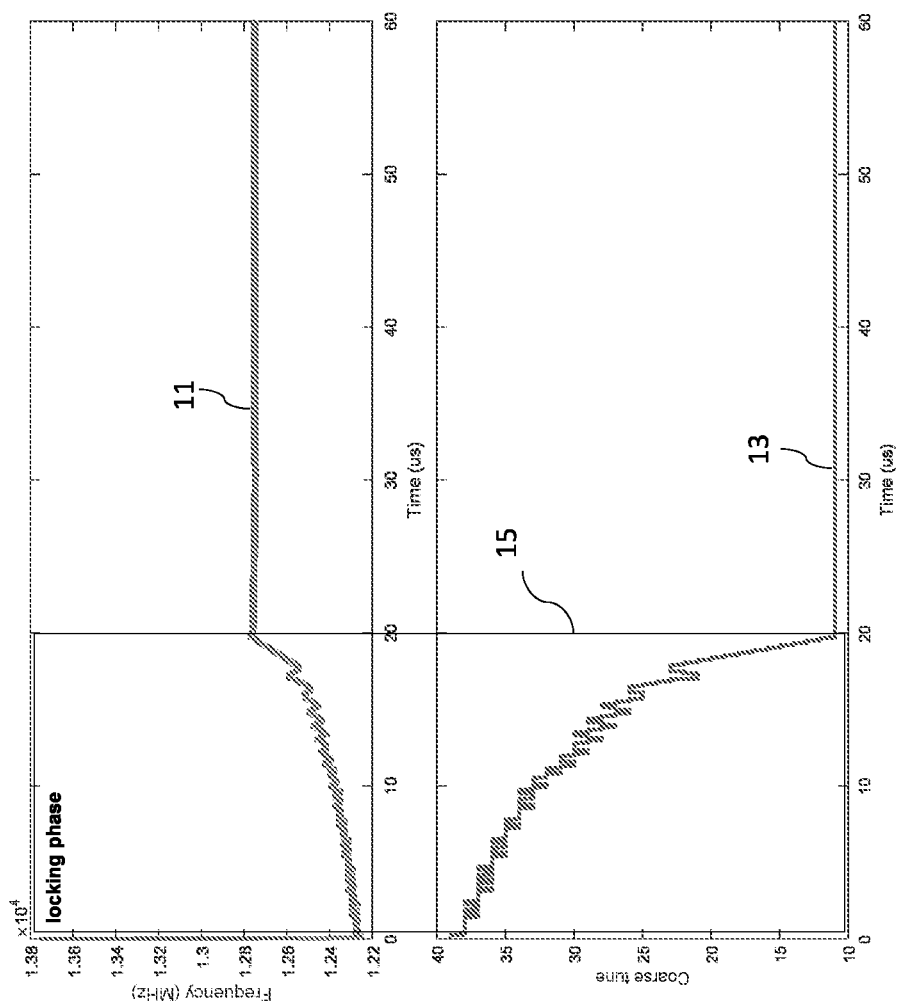
FIG. 1 illustrates the behavior of a digital phase-locked loop (DPLL) in acquisition mode and tracking mode, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component.

The present disclosure will be described with respect to examples in a specific context, namely DPLL circuits with a coarse time-to-digital converter (TDC) and a coarse digital loop filter (DLF) for achieving quick frequency lock in acquisition mode.

FIG. 1 illustrates the behavior of a digital phase-locked loop (DPLL) in acquisition mode and tracking mode, in an embodiment. In FIG. 1, the curve 11 in the top subplot shows the frequency of the output signal of a digitally controlled oscillator (DCO) of the DPLL over time, and the curve 13 in the bottom subplot shows the control word of the DCO over time. The DCO generates its output signal with a frequency specified by the control word. The vertical line 15 in FIG. 1 illustrates a time T that marks the end of the acquisition mode and beginning of the tracking mode. For ease of discussion, the frequency of the frequency signal generated by the DCO of the DPLL is also referred to as the frequency of the DCO, or the output frequency of the DCO in the discussion herein.

As illustrated in FIG. 1, when the DPLL is started at time zero, the frequency of the DCO has an initial value (e.g., about 12.25 GHz) that is far away (e.g., 500 MHz lower) from the target frequency (e.g., about 12.75 GHz). During the acquisition mode, the DPLL, through closed-loop control, gradually converges to the target frequency by adjusting the control word of the DCO. FIG. 1 shows that during the acquisition mode, the value of the control word decreases as the frequency of the DCO approaches the target frequency. At time T, the DPLL achieves frequency lock and transitions into the tracking mode. In the tracking mode, the DPLL fine tunes the control word of the DCO to compensate for smaller phase errors caused by, e.g., random noise in the system or minute difference between the frequency of a reference clock signal and the frequency of the DCO (or the frequency of the DCO divided by a dividing factor), and maintains frequency lock to the target frequency.

In some embodiments, in order to achieve quick frequency lock, the loop bandwidth of the DPLL during the acquisition mode is chosen to be wider than that of the DPLL during the tracking mode. As a result, the adjustment for the control word of the DCO during the acquisition mode is coarse, and the corresponding change in the frequency of the DCO has larger steps sizes. In contrast, during the tracking mode, the adjustment for the control word of the DCO is finer than during the acquisition mode, and the frequency of the DCO is much smoother, as illustrated in FIG. 1.

The example of FIG. 1 shows an ideal behavior of the DPLL. However, there are many challenges that may slow down the frequency lock (e.g., lengthen the duration of the acquisition mode), or even prevent the DPLL from achieving frequency lock. One of the challenges is cycle slipping. When cycle slipping happens, the estimate of phase error used by the DPLL to adjust the DCO control word may wrap around and change sign, thereby driving the control loop of the DPLL in the wrong direction. Cycle slipping may seriously degrade the frequency lock capability of the DPLL, and may even prevent the DPLL from achieving frequency lock. The present disclosure discloses various embodiments of DPLL that prevents or reduces the effect of cycle slipping, such that the DPLL is robust against cycle slipping and can achieve quick frequency lock during the acquisition mode.

Figure 2:
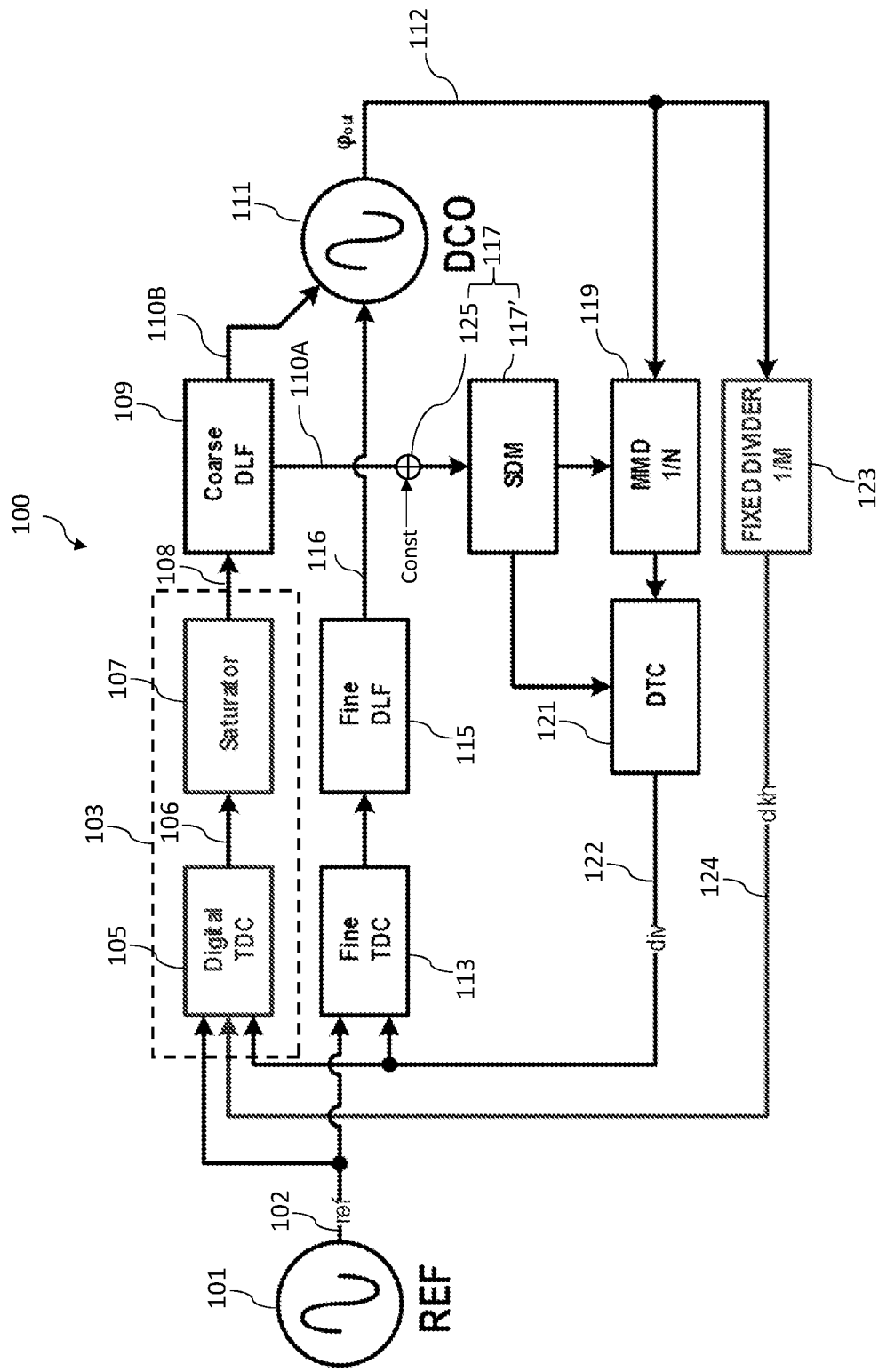
FIG. 2 illustrates a block diagram of a DPLL, in an embodiment.

FIG. 2 illustrates a block diagram of a DPLL 100, in an embodiment. The DPLL 100 includes a coarse time-to-digital converter (TDC) 103 and a coarse digital loop filter (DLF) 109 that are coupled between a reference clock source 101 and a digitally controlled oscillator (DCO) 111. The coarse TDC 103 further includes a TDC 105 and a saturation circuit 107 (also referred to as a saturator 107). As will be discussed in more details below, during the acquisition mode, the TDC 105 computes a phase error 106 for the DPLL. The phase error 106 is processed by the saturation circuit 107, which checks the phase error 106 to detect cycling slipping. If cycle slipping is detected, the saturation circuit 107 saturates the phase error 106 to a pre-determined saturation value (with the correct sign for the phase error 106) to reduce the effect of cycle slipping. The saturation circuit 107 also sets a flag signal to indicate detection of cycle slipping. The flag signal may be an internal signal of the saturator 107.

The output signal 108 of the saturation circuit 107 is sent to the coarse DLF 109. In some embodiments, the coarse DLF 109 is a proportional-integral (PI) filter comprising a proportional path 109A (see FIG. 3) and an integral path 109B (see FIG. 3). The proportional path 109A scales (e.g., multiplies) the output signal 108 by a scaling factor, and the integral path 109B integrates the output signal 108 using a delay element (e.g., a register, a D flip-flop, or the like). PI filter is known in the art, thus details are not discussed here.

In FIG. 2, the output signal 110A of the proportional path 109A of the coarse DLF 109 is added with a constant value by an adder circuit 125, and the output signal of the adder circuit 125 is sent to a sigma-delta modulator (SDM) 117' of the DPLL 100. The constant value at the input of the adder circuit 125 may be used to set the target frequency of the DPLL 100. For simplification and ease of discussion, the adder circuit 125 and the SDM 117' may be combined together and referred to as an SDM 117. The output signal 110B of the integral path 109B of the coarse DLF 109 is sent to the DCO 111 and used as a control word for the DCO 111. The DCO 111 generates a frequency signal 112 (e.g., a clock signal, or a sinusoidal signal) having a frequency indicated by (e.g., proportional to) the control word. Sigma-delta modulator (SDM) and DCO are known in the art, thus details are not discussed here.

Still referring to FIG. 2, the output of the SDM 117 is sent to a multi-modulus divider (MMD) 119. The MMD 119 is coupled to the output of the DCO 111. In some embodiments, the MMD 119 is a frequency divider circuit configured to divide its input frequency signal (e.g., 112) by a dividing factor N to generate an output frequency signal having a frequency that is 1/N of the frequency of the input frequency signal. In the illustrated embodiment, the dividing factor N of the MMD 119 is determined by the output of the SDM 117. In some embodiments, the output of the SDM 117 (which is the dividing factor N of the MMD 119) is a time-varying signal. The time-varying output of the SDM 117 may be due to the constant value at the input of the adder circuit 125 being a fractional number, and/or the output signal 110A of the coarse DLF 109 being a fractional number. Therefore, the MMD 109 has a variable dividing factor N, and the average dividing factor of the MMD 1o is not an integer number, but a real number. In other words, the MMD 119 functions as a frequency divider circuit with a real-valued dividing factor.

The output of the MMD 119 is sent to a digital-to-time converter (DTC) 121. The SDM 117 also sends a control signal to the DTC 121. The output frequency signal of the MMD 119 has jitter, due to the time-varying dividing factor N of the MMD 119. The DTC 121 is used to remove or reduce the jitter and to generate a clock signal 122 (labeled as "div" in FIG. 2) that is smoother (e.g., having less jitter). DTC is known in the art, thus details are not discussed here. The clock signal 122 is sent to the coarse TDC 103. As will be discussed in more details hereinafter, the coarse TDC 103 uses the clock signal 122 and a reference clock signal 102 generated by the reference clock source 101 to calculate the phase error.

In some embodiments, the SDM 117' and the DTC 121 are omitted in the DPLL 100, in which case the output of the adder circuit 125 is used to determine the dividing factor N of the MMD 119, and the output of the MMD 119 is sent directly to the coarse TDC 103 (and the fine TDC 113).

FIG. 2 also illustrates a frequency divider circuit 123 coupled to the output of the DCO 111. In the illustrated embodiment, the frequency divider circuit 123 is configured to divide the frequency signal 112 by a fixed dividing factor M (e.g., a value that is set by the user of the DPLL) and generate a clock signal 124 (labeled as "clkh" in FIG. 2). The clock signal 124 is sent to the coarse TDC 103 and used as a clock signal to drive some internal components of the coarse TDC 103.

FIG. 2 further illustrates a fine TDC 113 and a fine DLF 115 coupled between the reference clock source 101 and the DCO ill. The fine TDC 113 and the fine DLF 115 are used in the tracking mode to drive the DPLL 100. For example, during the tracking mode, the fine TDC 113 generates the phase error, and the fine DLF 115 (e.g., a PI filter) filters the phase error generated by the fine TDC 113, and generates an output signal 116 that is used as a control word for the DCO 111 in the tracking mode. The frequency signal 112 of the DCO 111 is frequency divided by the MMD 119 and sent to the fine TDC 113. In the example of FIG. 2, during the tracking mode, the output signals 110B of the coarse DLF 109 may have a constant value (e.g., a value the integral path 109B of the coarse DLF 109 converged to during the acquisition mode), and the output signal 110A of the coarse DLF 109 has little or no impact (e.g., having a zero or near-zero value) on the operation of the tracking mode. In some embodiments, the time-average of the dividing factor of the MMD 119 has a fixed value during the tracking mode. The fine TDC 113 and the fine DLF 115 may use any suitable circuit known and used in the art, details are not discussed here.

As illustrated in FIG. 2, the DPLL 100 is a closed-loop control system, with two parallel feed-forward paths coupled between the reference clock source 101 and the DCO 111. The first feed-forward path includes the coarse TDC 103 and the coarse DLF 109, and the second feed-forward path includes the fine TDC 113 and the fine DLF 115. The first feed-forward path and the second feed-forward path are designed such that during the acquisition mode, the first feed-forward path drives the DPLL 100 by generating the phase error and control word for the DCO 111, while the second feed-forward path has no effect or negligible effect on the operation of the DPLL 100. During the tacking mode, the second feed-forward path drives the DPLL 100 by generating the phase error and control word for the DCO 111, while the output signal 110B of the first feed-forward path remains constant (e.g., a constant value the integral path 109B of the coarse DLP 109 converged to during the acquisition mode). Therefore, during the tracking mode, the first feed-forward path may be considered inactive, the constant value of the output signal 110B of the first feed-forward path sets the frequency of the DCO to a target frequency, and the second feed-forward path generates phase error for the DPLL 100 to maintain frequency lock. In some embodiments, the DCO 111 uses the control word (e.g., 110B) from the coarse DLF 109 to control a first bank of capacitors in the DCO 111, and uses the control word (e.g., 116) from the fine DLF 115 to control a second bank of capacitors in the DCO 111.

In some embodiments, the loop bandwidth of the fine DLF 115 is chosen to be narrower than that of the coarse DLF log, such that during the acquisition mode, the DPLL 100 tracks frequency error to achieve frequency lock, and that during the tracking mode, the DPLL 100 tracks phase error to maintain frequency lock.

Figure 3:
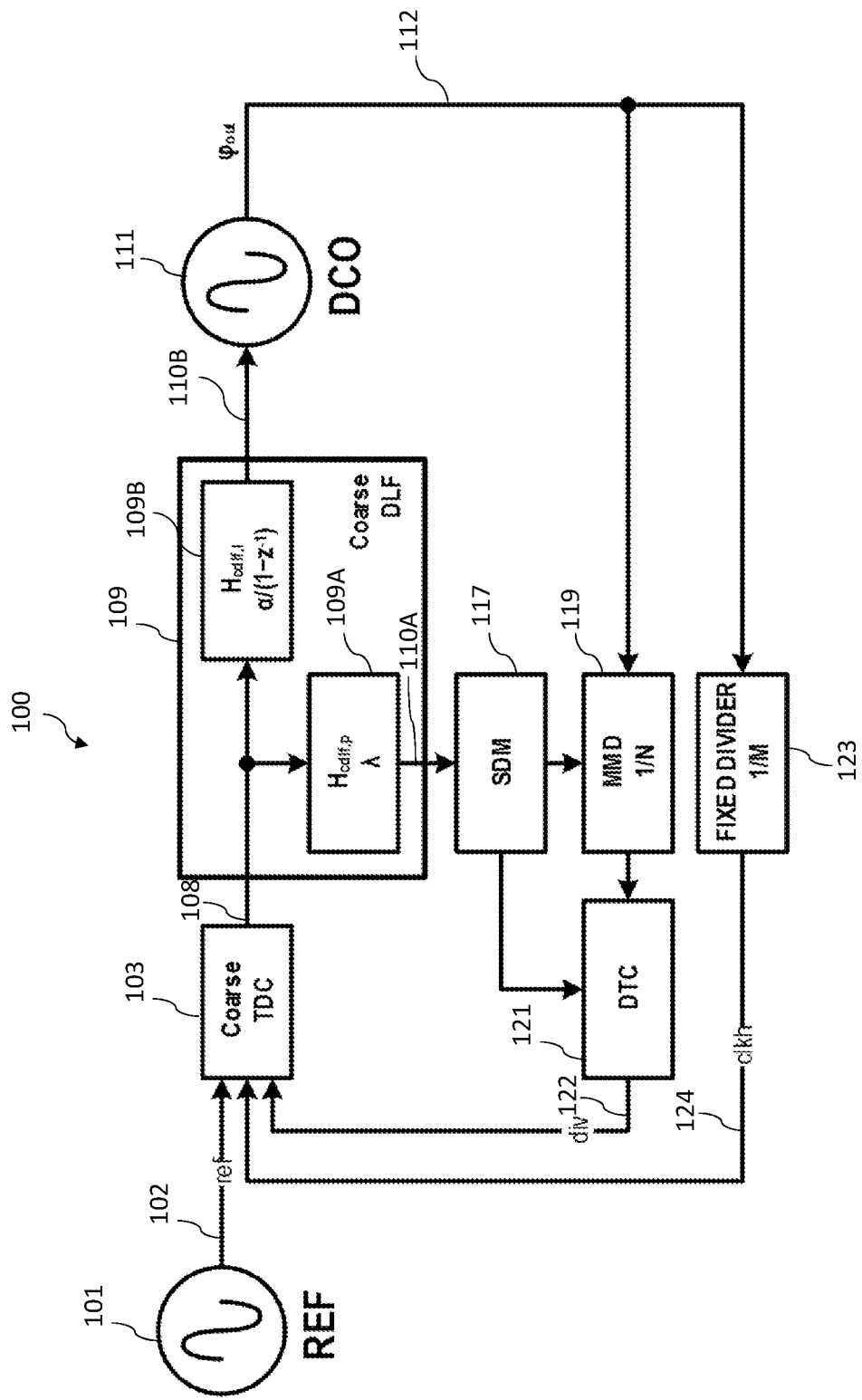
FIG. 3 illustrates the block diagram of the DPLL of FIG. 2 in acquisition mode, in an embodiment.

FIG. 3 illustrates the block diagram of the DPLL 100 of FIG. 2 in acquisition mode, in an embodiment. For simplicity, the second feedforward path in FIG. 2, which comprises the fine TDC 113 and the fine DLF 115, is omitted in FIG. 3. FIG. 3 shows the proportional path 109A and the integral path 109B of the coarse DLF 109. The SDM 117 in FIG. 3 corresponds to the adder circuit 125 and the SDM 117' in FIG. 2. Note that in FIGS. 2 and 3, the reference clock source 101 is shown for completeness and ease of discussion. The reference clock source 101 may not be a part of the DPLL 100. For example, the reference clock source 101 may be implemented outside of the DPLL 100.

Figure 4:
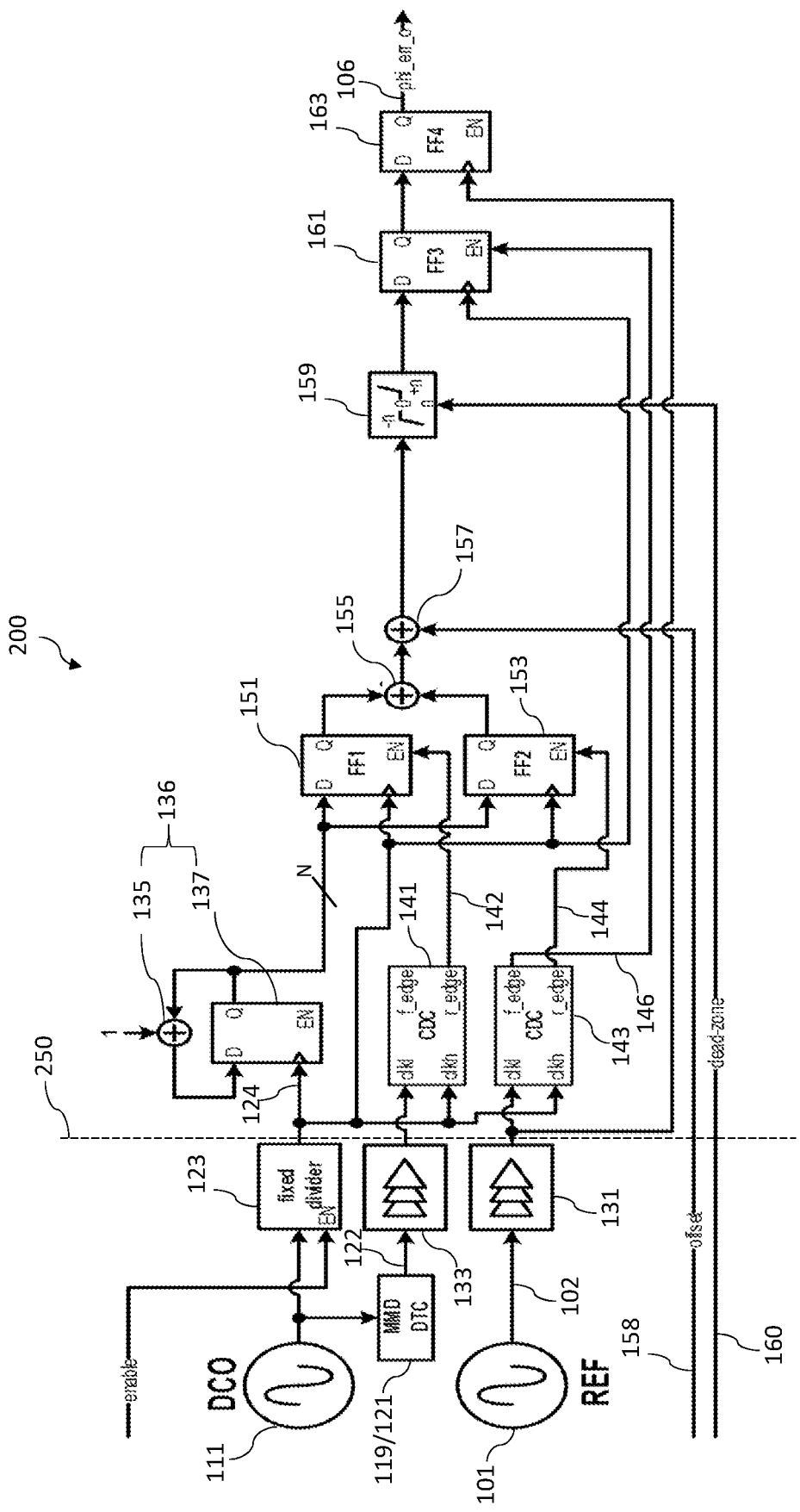
FIG. 4 illustrates a schematic diagram of a time-to-digital converter (TDC) of the DPLL of FIG. 2, in an embodiment.

FIG. 4 illustrates a schematic diagram of a TDC 200, in an embodiment. The TDC 200 may be used as the TDC 105 of the coarse TDC 103 in FIG. 2. Note that the TDC 200 includes the components on the right side of the dashed line 250 in FIG. 4. On the left side of the dashed line 250, some components of the DPLL 110 (e.g., DCO 111, the frequency divider circuit 123, and the MMD 119/DTC 121) are shown to facilitate discussion of the functionality of the TDC 200, but these components are not part of the TDC 200. Note that FIG. 4 also illustrates two path delay elements 131 and 133 on the left side of the dashed line 250, which path delay elements 131 and 133 are used to model the different path delays (e.g. propagation delays) experienced by the reference clock signal 102 and the clock signal 122. The different path delays cause a fixed phase offset between the reference clock signal 102 and the clock signal 122, which fixed phase offset will be compensated in the computation of the phase error, as discussed hereinafter.

As illustrated in FIG. 4, the reference clock signal 102 is sent to a first input terminal (labeled as "clkl" in FIG. 4) of an edge detection circuit 143 (also referred to as a clock-domain-crossing (CDC) circuit), and the clock signal 124 is sent to a second input terminal (labeled as "clkh" in FIG. 4) of the edge detection circuit 143. Similarly, the clock signal 122 is sent to a first input terminal (labeled as "clkl" in FIG. 4) of an edge detection circuit 141, and the clock signal 124 is sent to a second input terminal (labeled as "clkh" in FIG. 4) of the edge detection circuit 141. In some embodiments, the edge detection circuit 141 (or 143) is configured to detect the rising edges and the falling edges of the signal (e.g., 102 or 122) applied at the first input terminal labeled "clkl." The signal (e.g., 124) applied at the second input terminal of the edge detection circuit 141 (or 143) is used as the clock signal for the edge detection circuit. An example of the edge detection circuit is illustrated in FIG. 5.

Figure 5:
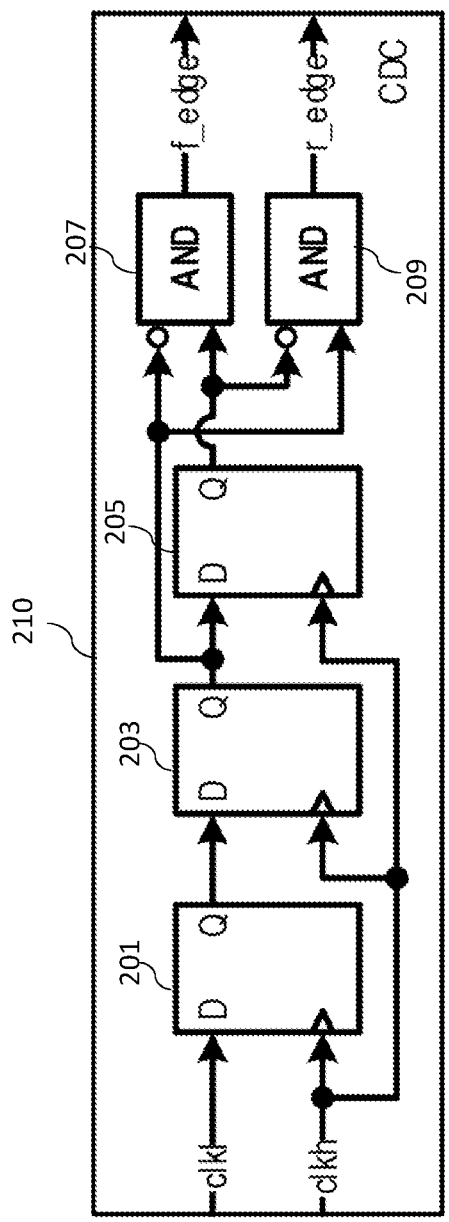
FIG. 5 illustrates a schematic diagram of an edge detection circuit of the TDC of FIG. 4, in an embodiment.

Referring temporarily to FIG. 5, which illustrates an edge detection circuit 210. The edge detection circuit 210 may be used as the edge detection circuits 141 and 143 in FIG. 4. The edge detection circuit 210 comprises three D flip-flops 201, 203, and 205, and two AND gates 207 and 209. The AND gate 207 performs a logic AND operation on the output of the D flip-flop 205 and an inverse of the output of the D flip-flop 203. Note that the output of the D flip-flop 205 corresponds to the previous output of the D flip-flop 203. Therefore, the AND gate 207 generates a logic high output when the previous output of the D flip-flop 203 is logic high and the current value of the D flip-flop 203 is logic low, which represents a falling edge in the input signal applied at the first input terminal labeled as "clkl." The output terminal of the AND gate 207 is therefore labeled as "f_edge" to indicate the falling edge detection, and the output terminal f_edge outputs a positive pulse when a falling edge is detected. Similarly, the AND gate 209 generates a logic high output when the previous output of the D flip-flop 203 is logic low and the current value of the D flip-flop 203 is logic high, which represents a rising edge in the input signal applied at the first input terminal labeled as "clkl." The output terminal of the AND gate 209 is therefore labeled as "r_edge" to indicate the rising edge detection, and the output terminal r_edge outputs a positive pulse when a rising edge is detected.

Referring back to FIG. 4, the output terminal r_edge of the edge detection circuit 141 is coupled to an enable terminal of a D flip-flop 151, and the output terminal r_edge of the edge detection circuit 143 is coupled to an enable terminal of a D flip-flop 153. The D flip-flops 151 and 153 are clocked by the clock signal 124. The input to the D flip-flops 151 and 153 is the output of counter circuit 136, which counter circuit 136 is formed by a D flip-flop 137 and an adder 135. The counter circuit 136 is incremented by 1 for each clock cycle of the clock signal 124. In other words, the counter circuit 136 counts the number of clock cycles in the clock signal 124.

In the example of FIG. 4, a rising edge in the clock signal 122 enables the D flip-flop 151 to latch the output of the counter circuit 136, and a rising edge in the reference clock signal 102 enables the D flip-flop 153 to latch the output of the counter circuit 136. The difference between the latched values in the D flip-flops 151 and 153 is calculated by a subtractor circuit 155. One skilled in the art will readily appreciate that the difference between the latched values in the D flip-flops 151 and 153 indicates (e.g., in proportional to) the phase difference between the reference clock signal 102 and the clock signal 122. Therefore, the output of the subtractor circuit 155 is used as the phase error of the DPLL 100, which phase error is further processed/modified as described below.

In some embodiments, cycle slipping happens when the phase error calculation is off by one clock cycle (e.g., by one period of the reference clock 102), which causes the calculated phase error to wrap around and have a wrong sign (e.g., opposite sign of the true phase error). The incorrect phase error with wrong sign may cause slowdown of the acquisition mode, or may even cause the DPLL 100 to fail to achieve frequency lock. The saturation circuit 107 of the coarse TDC 103 reduces the adverse effect of cycle slipping by saturating the phase error to a pre-determined value with correct sign, details are discussed hereinafter.

In the example discussed above, the phase error is calculated by computing the time difference between a rising edge of the reference clock signal 102 and a corresponding (e.g., closest) rising edge of the clock signal 122, where the time difference is indicated by (e.g., proportional to) the difference in the output values of the counter circuits 136 at the two rising edges. This is, of course, a non-limiting example. The phase error may also be calculated by computing the time delay between a rising edge of the reference clock signal 102 and a corresponding (e.g., closest) falling edge of the dock signal 122, or between a falling edge of the reference clock signal 102 and a corresponding (e.g., closest) falling edge of the clock signal 122, or between a falling edge of the reference clock signal 102 and a corresponding (e.g., closest) rising edge of the clock signal 122. These and other variations are fully intended to be included within the scope of the present disclosure.

FIG. 4 further illustrates an adder circuit 157, which adds an offset value supplied by an input signal 158 to the output of the subtractor circuit 155. The offset value is used to compensate for the fixed phase offset between the reference clock signal 102 and the clock signal 122, where the fixed phase offset is caused by the different propagation delays of the reference clock signal 102 and the clock signal 122. Therefore, the output of the adder circuit 157 is the phase error between the reference clock signal 102 and the clock signal 122 and is free of the effect of the different propagation delays.

Next, the output of the adder circuit 157 is sent to a dead-zone circuit 159, which implements a dead-zone function. The dead-zone function may be written as:

$$f(x) = \begin{cases} x, \text{ if } |x| > n \\ 0, \text{ if } |x| \le n \end{cases}$$

In other words, the dead-zone circuit 159 outputs a zero value if the absolute value of its input signal is equal to or smaller than a threshold, and outputs the input signal if the absolute value of the input signal is larger than the threshold. The threshold of the dead-zone circuit 159 is supplied by an input signal 160.

Figure 6:
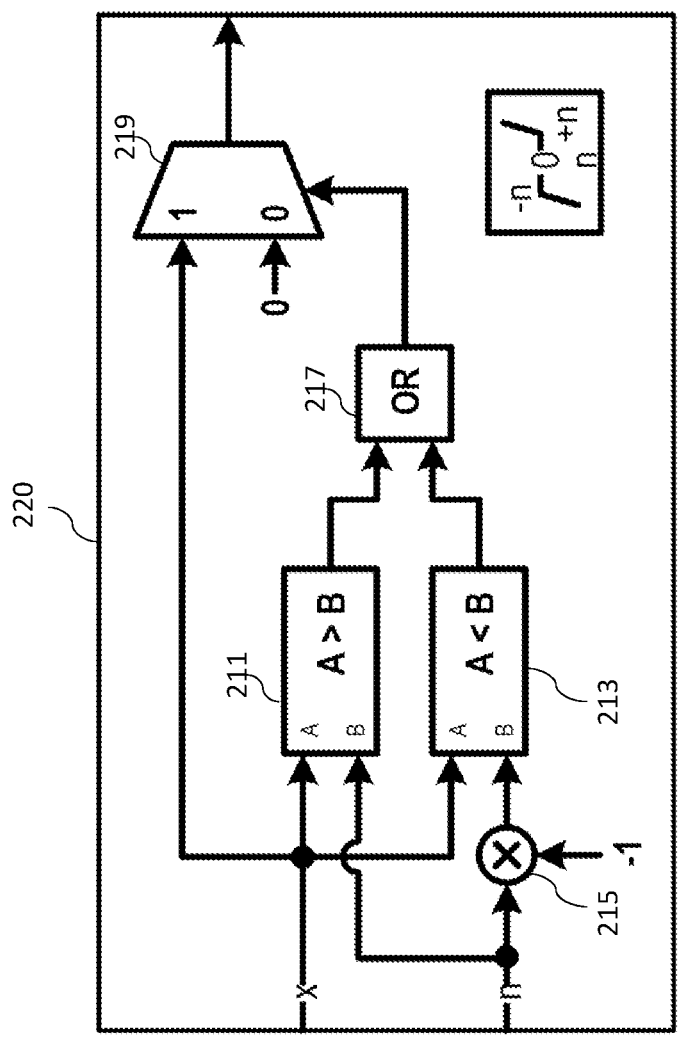
FIG. 6 illustrates a schematic diagram of a dead-zone circuit of the TDC of FIG. 4, in an embodiment.

The dead-zone circuit 159 may advantageously filter out small, random phase errors caused by, e.g., random noise in the system. In some embodiments, during the tracking mode, the phase error computed at the output of the adder circuit 157 is smaller than the threshold of the dead-zone circuit 159, and therefore, the output of the dead-zone circuit 159 is zero. This allows the fine TDC 113 and the fine DLF 115 to drive the DPLL 100 in tracking mode without being affected by the coarse TDC 103 and the coarse DLF 109. FIG. 6 illustrates a schematic diagram of a dead-zone circuit 220, in an embodiment. The dead-zone circuit 220 may be used as the dead-zone circuit 159 in FIG. 4.

Still referring to FIG. 4, the output of the dead-zone circuit 159 is sent to a D flip-flop 161. The clock terminal of the D flip-flop 161 is coupled to the clock signal 124, and the enable terminal of the D flip-flop 161 is coupled to the output terminal f_edge of the edge detection circuit 143. The output of the D flip-flop 161 is sent to a D flip-flop 163. The D flip-flop 163 is clocked by the reference clock signal 102. The output of the D flip-flop 163 is the phase error 106 calculated by the TDC 200.

Figure 7:
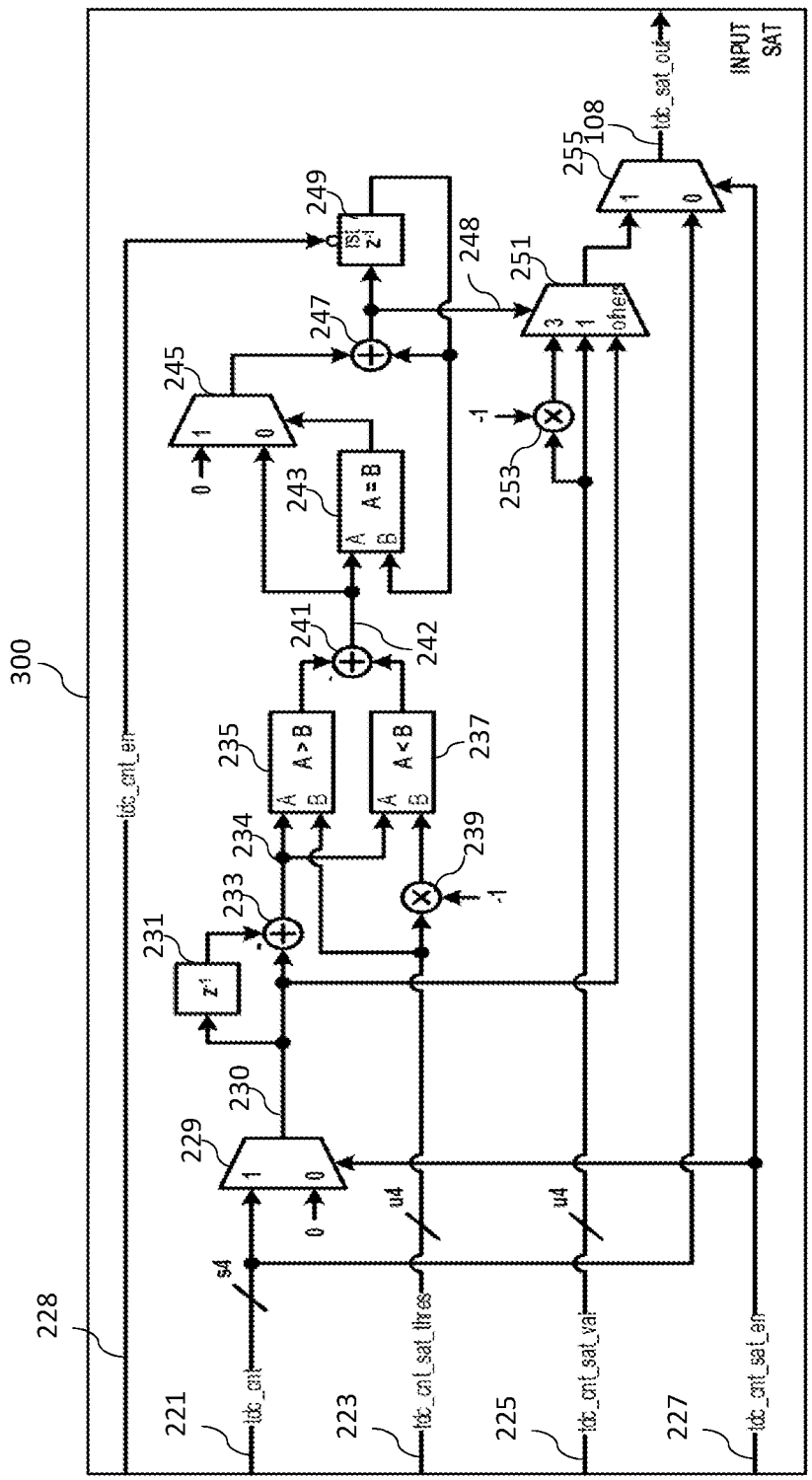
FIG. 7 illustrates a schematic diagram of a saturation circuit of the DPLL of FIG. 2, in an embodiment.

FIG. 7 illustrates a schematic diagram of a saturation circuit 300, in an embodiment. The saturation circuit 300 may be used as the saturation circuit 107 of the coarse TDC 103 in FIG. 2. In the example of FIG. 2, the phase error 106 generated by the TDC 105 is processed by the saturator 107 to generated an output signal 108, which output signal 108 is then sent to the coarse DLF 109.

Referring to FIG. 7, the saturation circuit 300 is configured to detect cycle slipping using the phase error 106 (applied as an input signal 221 of the saturation circuit 300), and in response to detecting cycle slipping, modify the phase error 106 to reduce or prevent the adverse effect of cycle slipping on the operation of the DPLL 100. Therefore, the output signal 108 of the saturation circuit 300 is the phase error 106 when no cycle slipping is detected, and is a modified value (e.g., a pre-determined saturation value) when cycle slipping is detected. Details are discussed hereinafter.

In FIG. 7, the input signal 221 of the saturation circuit 300 is the phase error 106 in FIG. 4 (or FIG. 2). The input signal 221 is sent to a first input terminal of a multiplexer (MUX) 229. A second input terminal of the MUX 229 is coupled to a zero value. The control terminal of the MUX 229 is coupled to an input signal 227, which is the enable signal for the saturation circuit 300. When the input signal 227 is set to 1, the input signal 221 (the phase error) is selected as the output signal 230 of the MUX 229; otherwise, a value of zero is selected as the output signal 230 of the MUX 229.

Still referring to FIG. 7, a subtractor circuit 233 of the saturation circuit 300 generates an output signal 234 by computing a difference between the present value of the output signal 230 and the previous value of the output signal 230 (which is stored by a delay element 231 such as a D flip-flop). The output signal 234 of the subtractor circuit 233 is compared with a positive threshold Sat_Thres by a comparator 235, and is compared with a negative threshold–1×Sat_Thres by a comparator 237. The positive threshold Sat_Thres is a programmable value supplied by an input signal 223. The output of the comparator 235 (e.g., having a value of 1 or 0) is subtracted from the output of the comparator 237 (e.g., having a value of 1 or 0) by a subtractor circuit 241 to generate an output signal 242.

In some embodiments, when the output signal 234 is larger than the positive threshold Sat_Thres, the output signal 242 has a value of –1. When the output signal 234 is smaller than the negative threshold–1×Sat_Thres, the output signal 242 has a value of +1. When the output signal 234 is between the positive threshold Sat_Thres and the negative threshold–1×Sat_Thres, the output signal 242 has a value of 0. In other words, the output signal 234 is compared with a range R defined by an upper boundary Sat_Thres and a lower boundary–1×Sat_Thres. When the output signal 242 is above the upper boundary Sat_Thres of the range R, below the lower boundary–1×Sat_Thres of the range R, or within the range R, the output signal 242 has a value of –1, 1, or 0, respectively.

Still referring to FIG. 7, the output signal 242 is compared with a value stored in a delay element 249 (e.g., a D flip-flip) by a comparator 243. The delay element 249 may have an initial value of zero after power-on or a reset. The comparator 243 outputs a value of 1 if the output signal 242 is equal to the value stored in the delay element 249, and outputs a value of zero otherwise. An input signal 228 functions as an enable signal for the delay element 249.

The output of the comparator 243 is used a control signal for a MUX 245. When the output of the comparator 243 is 0, the output signal 242 is selected as the output of the MUX 245; otherwise, the MUX 245 outputs a value of 0. The output of the MUX 245 is added with the stored value of the delay element 249 by an adder circuit 247. The output signal 248 of the adder circuit 247 is used as the control signal for a MUX 251. In the illustrated embodiment, the output signal 248 is represented by a 2-bit value. When the output signal 248 is 1, the MUX 251 outputs a positive saturation value Sat_Val, where the positive saturation value Sat_Val is a programmable value supplied by an input signal 225. When the output signal 248 is –1, the MUX 251 outputs a negative saturation value–1×Sat_Val, this is because the two-bit two's complement representation of a value –1 is oB11, and oB11 is interpreted as an unsigned integer value 3 by the MUX 251 as the control signal of the MUX 251. When the output signal 248 has other values (e.g., 0), the MUX 251 outputs the output signal 230 (e.g., the phase error 1o6) of the MUX 229.

The output of the MUX 251 is sent to a first input terminal of a MUX 255, and the input signal 221 is sent to a second input terminal of the MUX 255. The input signal 227, which is the enable signal for the saturation circuit 300, selects the output of the MUX 251 as the output of the MUX 255 when the input signal 227 has a value of 1; otherwise, the input signal 227 selects the input signal 221 as the output of the MUX 255.

One skilled in the art will readily appreciate that the operation of the saturation circuit 300 may be described as follows: assuming that the input signal 227 is 1 (to enable the saturation circuit 300), a difference (e.g., value of the output signal 234) between the present value of the phase error 106 and the previous value of the phase error 106 is calculated. The difference is compared with a range R defined by an upper boundary Sat_Thres and a lower boundary–1×Sat_Thres. When the difference is within the range R, no cycle slipping is detected, and the present value of the phase error 106 is passed through (e.g., unmodified) the saturation circuit 300 as the output of the saturation circuit 300. When the difference is outside the range R, a cycle slipping is detected. In response to detection of cycle slipping, a non-zero value (e.g., 1 or –1) is saved in the delay element 249 as a flag signal for cycle slipping. A non-zero value of 1 in the delay element 249 may indicate a wrap-around of the phase error 106 from a positive value to a negative value due to cycle slipping, and a non-zero value of –1 in the delay element 249 may indicate a wrap-around of the phase error 106 from a negative value to a positive value due to cycle slipping. The flag signal is held in the delay element 249 until a new wrap-around of the phase error, in the opposite direction, is detected, in some embodiments. To reduce the effect of cycle slipping, the phase error 106, which has wrapped around due to cycle slipping, is replaced by a pre-determined saturation value with an opposite sign of the (wrapped-around) phase error as the output of the saturation circuit 300. For example, when the difference (e.g., value of the output signal 234) is larger than the upper boundary Sat_Thres of the range R, a pre-determined negative saturation value of −1×Sat_Val is used as the output of the saturation circuit 300. Conversely, when the difference is smaller than the lower boundary−1×Sat_Thres of the range R, a pre-determined positive saturation value of Sat_Val is used as the output of the saturation circuit 300.

Figure 8:
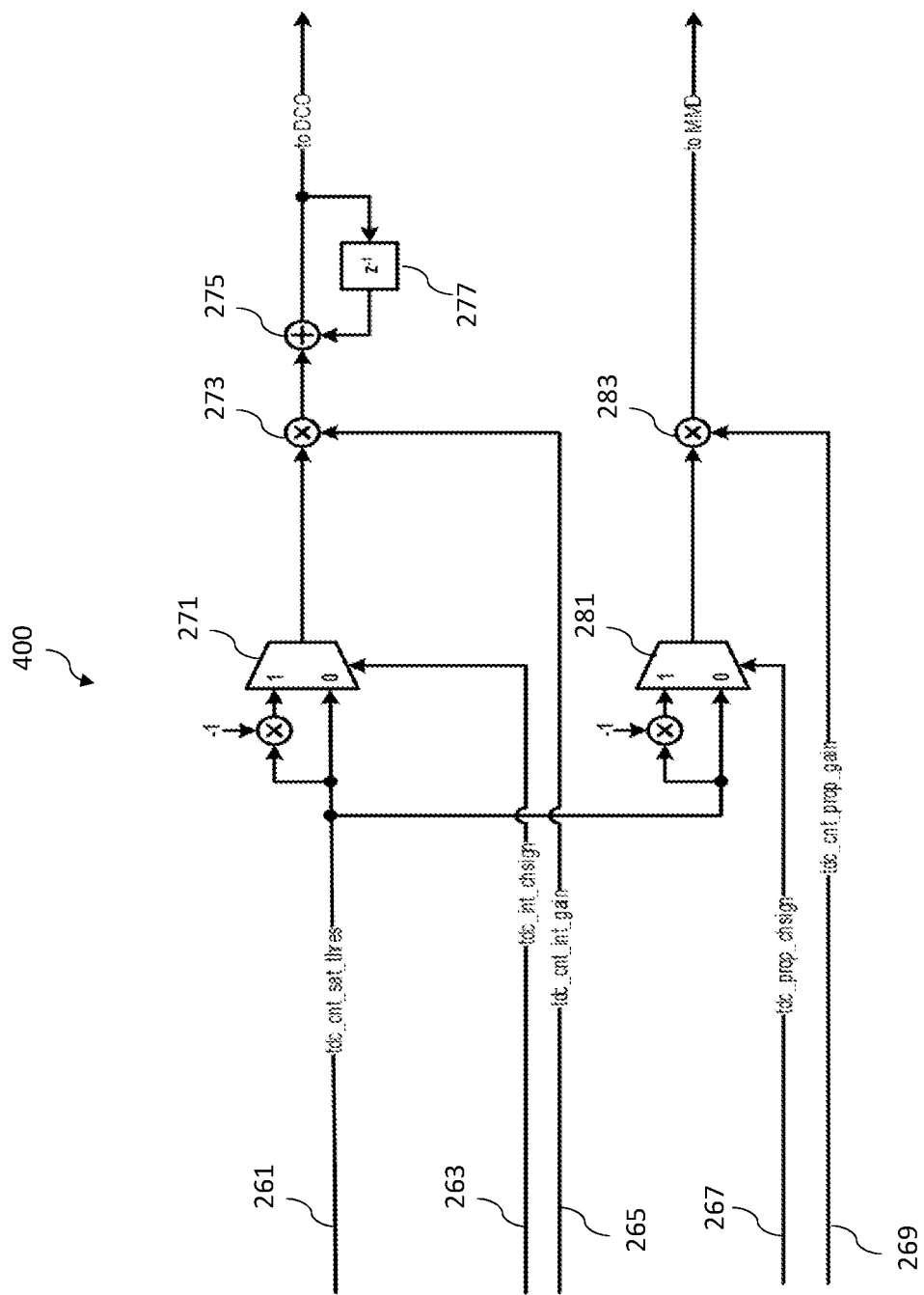
FIG. 8 illustrates a schematic diagram of a digital loop filter (DLF) of the DPLL of FIG. 2, in an embodiment.

FIG. 8 illustrates a schematic diagram of a digital loop filter (DLF) 400, in an embodiment. The DLF 400 may be used as the coarse DLF 109 in FIG. 2. The DLF 400 accepts an input signal 261, which corresponds to the output signal 108 of the saturation circuit 107 in FIG. 2. The multiplier 283 corresponds to the proportional path of the DLF 400, and scales the input signal 261 with a programmable gain factor supplied by an input signal 269. The multiplier 273 and the integrator (which is formed by an adder 275 and a delay element 277) correspond to the integral path of the DLF 400. An input signal 265 supplies a programmable scale factor for the multiplier 273. FIG. 8 further illustrates two input signals 263 and 267 for inverting the sign of the input signal 261. For example, when the input signal 263 (or 267) has a value of 1, the MUX 271 (or MUX 281) selects the inverted value of input signal 261 (e.g., multiplied with −1 to change its sign) as its output.

Figure 9A:
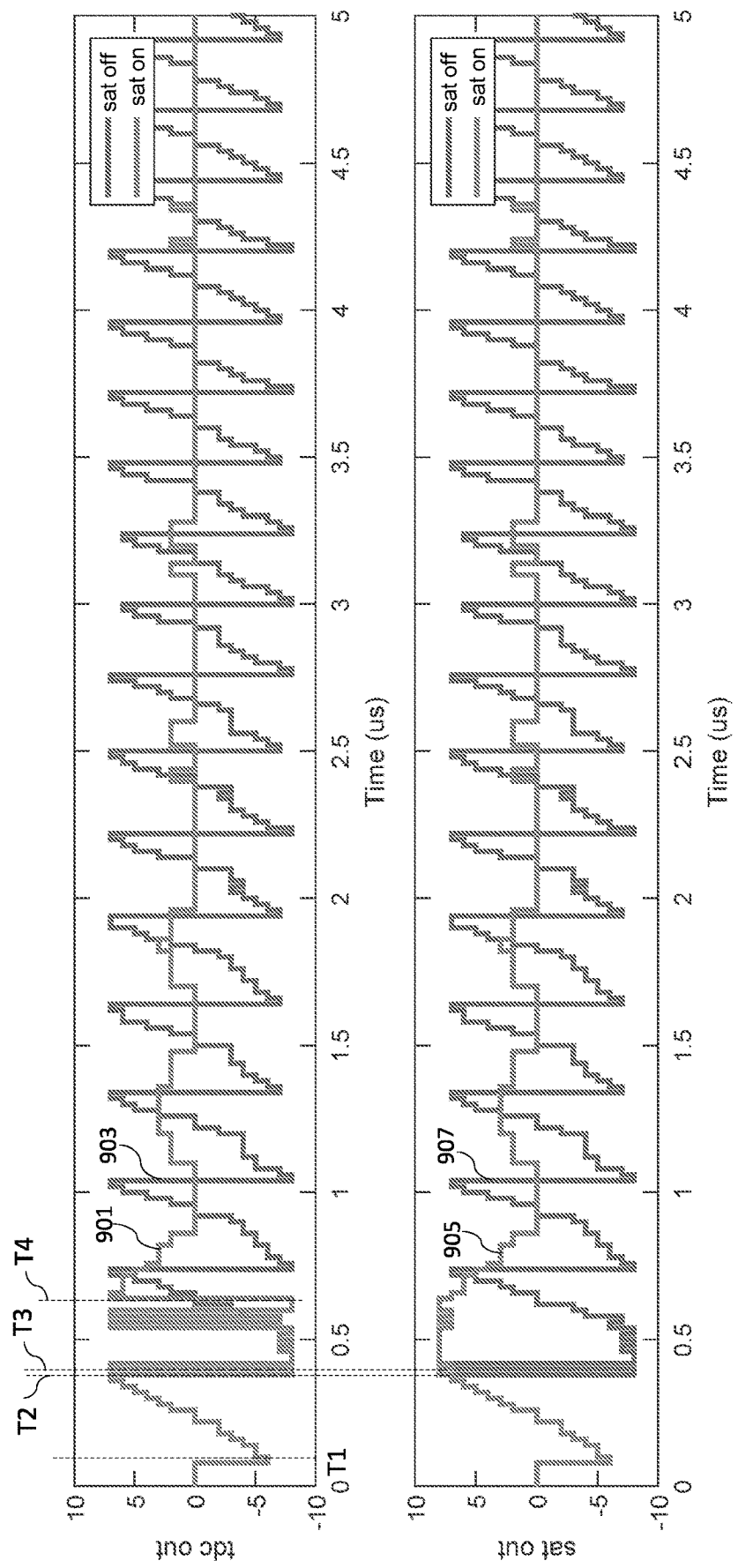
FIGS. 9A and 9B illustrate the performance of the DPLL of FIG. 2, in an embodiment.
Figure 9B:
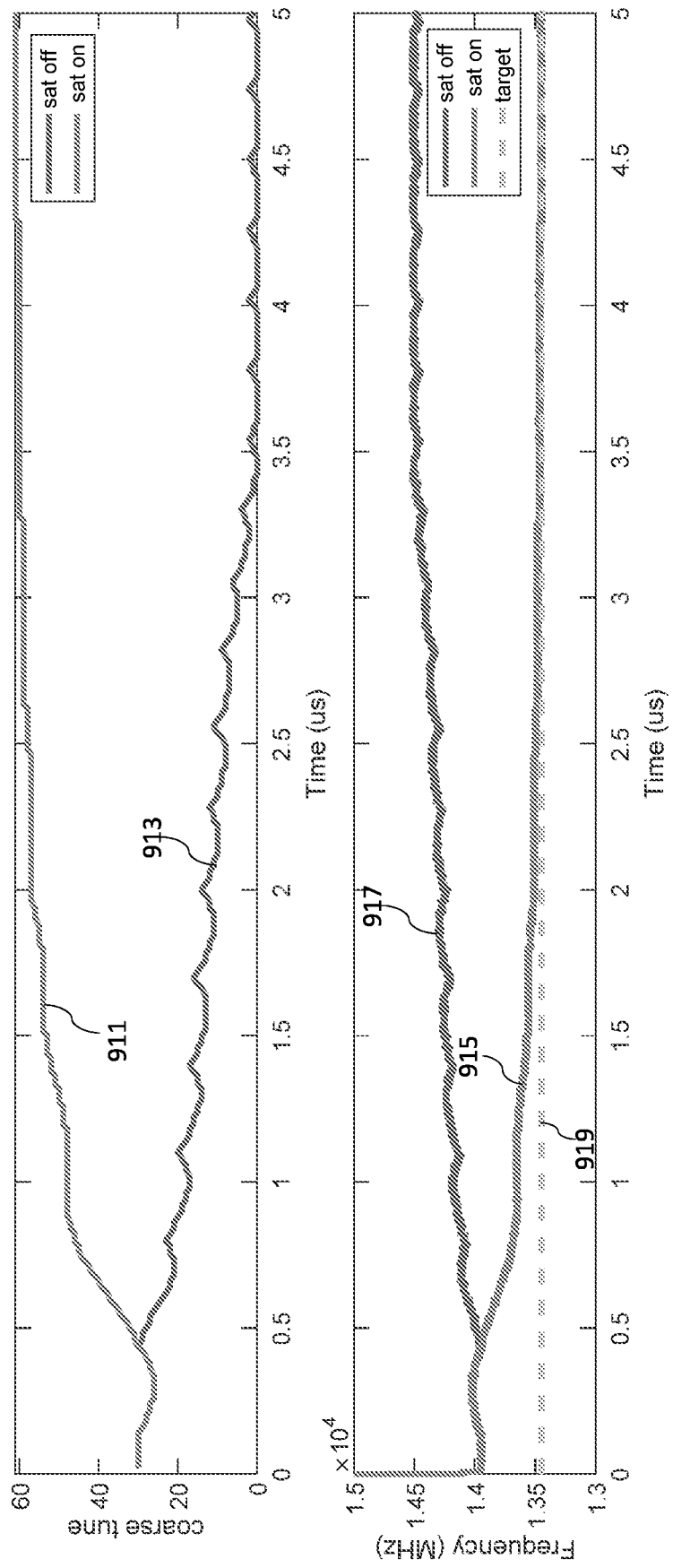

FIGS. 9A and 9B illustrate the performance of the DPLL 10o of FIG. 2 in acquisition mode, in an embodiment. For comparison purpose, FIGS. 9A and 9B show the performance of the DPLL 100 with the saturation circuit 107 enabled (e.g., input signal 227 in FIG. 7 having a value of 1) and with the saturation circuit 107 disabled (e.g., input signal 227 in FIG. 7 having a value of 0).

In FIG. 9A, the top subplot shows the output of the TDC 105, with the curves 901 and 903 corresponding to saturation circuit on (e.g., enabled) and saturation circuit off (e.g., disabled), respectively. The bottom subplot of FIG. 9A shows the output of the saturation circuit 107, with the curves 905 and 907 corresponding to saturation circuit on and saturation circuit off, respectively. In FIG. 9B, the top subplot shows the output of the coarse DLF 109 (e.g., control word for DCO), with the curves 911 and 913 corresponding to saturation circuit on and saturation circuit off, respectively. The bottom subplot of FIG. 9B shows the output of the DCO 111, with the curves 915 and 917 corresponding to saturation circuit on and saturation circuit off, respectively.

In the example of FIG. 9A, the DPLL 100 is started in the acquisition mode at time T1. Due to the difference between the initial frequency of the DCO 111 and the target frequency, the phase error calculated by the TDC 105 starts to increase from time T1. Note that in FIG. 9A, at the beginning of the acquisition mode, the curve 901 overlaps with the curve 903. At time T2, a cycle slipping happens. Due to the cycle slipping, the calculated phase error (which, when represented in phase angle, is between −π and +π), now wraps around from a large positive value (e.g., corresponding to a phase near +π) to a large negative value (e.g., corresponding to a phase near −π) at time T2. The wrap-around in the phase error at time T2 causes the output signal 234 in FIG. 7 to decrease below the lower boundary−1× Sat_Thres of the range R, which causes the output signal 242 to become 1. As a result, the saturation circuit 107 outputs the positive threshold value Sat_Val as the modified phase error. Note that the modified phase error at time T2 has the correct sign (e.g., positive sign), and its magnitude is close to the magnitude of the calculated phase error before time T2. Additional behavior of the saturation circuit 107 in response to cycle slipping, such as at time T3 and time T4, may be explained using the description of the saturation circuit 107 discussed above, details are not discussed here. At time T4, the DPLL 100 recovers from the cycle slipping.

The modified phase error provided by the saturation circuit 107 avoids the disruption the un-modified phase error (e.g., having wrong sign) would have on the DPLL 100, and allows the DPLL 100 to continue its trajectory toward frequency lock. As a result, the DPLL 100 is robust against cycle slipping, and achieves quick frequency lock. As shown by the curve 915 in FIG. 9B, the frequency of the DCO 111 quickly approaches the target frequency indicated by the dashed line 919 in FIG. 9B. In contrast, when the saturation circuit 107 is disabled, the cycle slipping causes the calculated phase error to oscillate between positive and negative values (see curves 903 and 907), which prevents the DPLL 100 from achieving frequency lock. As illustrated by the curves 911 and 917 in FIG. 9B, when the saturation circuit 107 is disabled, the frequency of the DCO 111 actually diverges from the target frequency.

Figure 10:
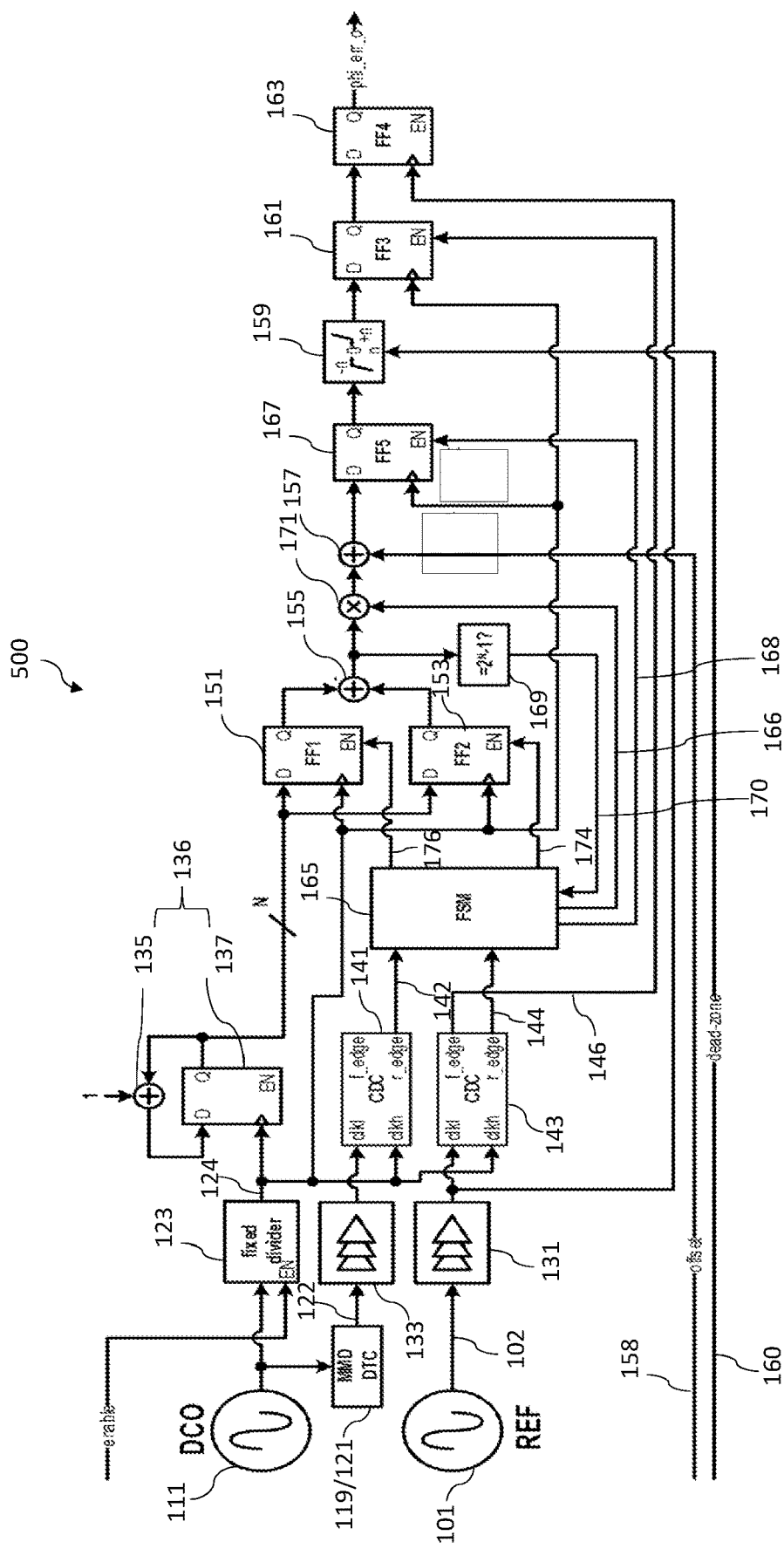
FIG. 10 illustrates a schematic diagram of a coarse TDC, in an embodiment.

FIG. 10 illustrates a schematic diagram of a coarse TDC 500, in an embodiment. The coarse TDC 500 may be used as the coarse TDC 103 of FIG. 2. Compared with the example of FIG. 2 where the coarse TDC 103 is implemented as the TDC 105 followed by a saturation circuit 107, the coarse TDC 500 does not use the saturation circuit 107. Instead, the coarse TDC 500 uses a finite-state machine (FSM) 165 to decide the sign of the phase error and to saturate the phase error if needed. Details are discussed hereinafter. For brevity, elements in FIG. 10 having the same reference numerals as elements in FIG. 4 are not re-described.

In FIG. 10, the edge detection circuit 143 generates an edge detection signal 144 indicating first edges (e.g. rising edges) of the reference clock signal 102, and the edge detection circuit 141 generates an edge detection signal 142 indicating second edges (e.g. rising edges) of the clock signal 122. Each first edge and a corresponding second edge are used to calculate a phase error, where the corresponding second edge is a closest second edge to the first edge. In the illustrated embodiment, the first edges and the second edges are both rising edges. This is merely a non-limiting example. The first edges may be rising edges or falling edges, the second edges may be rising edges or falling edges, and the first edges and the second edges may be the same type of edges (e.g., rising edges or falling edges) or different types of edges.

The FSM 165 decides the sign of the phase error based on whether the first edge precedes a corresponding second edge. If the first edge precedes the second edge, the FSM 165 enters an "UP" state, and assigns a positive sign (e.g., +1) for the phase error. If the second edge precedes the first edge, the FSM 165 enters a "DOWN" state, and assigns a negative sign (e.g., −1) for the phase error. The assigned sign (e.g., +1 or −1) is sent as an output signal 166 of the FSM 165, and is multiplied with the output of the subtractor circuit 155 (which gives the magnitude of the phase error) by a multiplier 171 to generate the phase error.

The output of the subtractor circuit 155 is compared with a pre-determined threshold using a comparator 169. If the output of the subtractor circuit 155 is equal to or larger than the pre-determined threshold, then the output of the subtractor circuit 155 is saturated to the pre-determined threshold. For example, for a four-bit counter circuit 136, the pre-determined threshold may be 15, or a smaller value such as 14. The saturation function limits or prevents the adverse effect of cycle slipping to improve the robustness of the DPLL and achieve quick frequency lock in acquisition mode. The FSM 165 uses the output of the comparator 169 and other signals to generate an output enable signal 168, which is used as the enable signal for a D flip-flop 167 to enable or disable outputting of the calculated phase error.

More details of the operation of the FSM 165 are discussed below. In some embodiments, starting from an initial idle state, the FSM 165 monitors the edge detection signals 142 and 144. If a first edge of the reference clock signal 102 arrives first (e.g., before a second edge of the clock signal 122 arrives), the FSM 165 enters the "UP" state, and assigns a positive sign for the phase error. In the UP state, the FSM 165 generates an enable signal 176 to latch the output value of the counter circuit 136 into the D flip-flop 151 (also referred to as the start value register 151), and generates an enable signal 174 to latch the output value of the counter circuit 136 into the D flip-flop 153 (also referred to as the stop value register 153). The state transition table in FIG. 13 shows details of how the enable signals 176 and 174 are generated. In some embodiments, in the UP state, the start value register 151 latches a first value of the counter circuit 136 when a first edge of the reference clock signal 102 arrives, and the stop value register 153 latches a second value of the counter circuit 136 when a corresponding second edge of the clock signal 122 arrives.

The magnitude (e.g., absolute value) of the difference between the latched second value and the latched first value is the time delay between the first edge and the corresponding second edge, and is used as the magnitude of the phase error. In the illustrated embodiment, the output of the subtractor circuit 155, which is the difference between the latched value of the stop value register 153 and the latched value of the start value register 151, is a two's complement number, which ensures that the calculated difference correctly indicates the time delay between the first edge and the corresponding second edge, even when the output of the counter circuit 136 wraps around. To illustrate, consider an example where the counter circuit 136 is a four-bit counter that counts from 0 to 15, then counts (e.g., wraps back) to zero at the next clock cycle. Assume that the start value register 151 latches a value of 14 at the first edge, and the stop value register 153 latches a value of 1 at the second edge. Note that the latched value of 1 is caused by the wrap-around of the counter circuit 136 (e.g., counting to 15, then wrapping back to zero and counting to 1). The output of the subtractor circuit 155 has a value of −13 in two's complement format, which when interpreted as an unsigned integer number, give a value of 3 that indicates the correct time delay between the first edge and the second edge.

In the UP state, the FSM 165 generates the output enable signal 168 when the corresponding second edge arrives after the first edge, or when the difference between the latched values in the stop value register 153 and the start value register 151 is equal to the pre-determined threshold (e.g., 15 for a four-bit counter circuit 136).

Operation of the FSM 165 in the DOWN state is similar. For example, starting from an initial idle state, the FSM 165 monitors the edge detection signals 142 and 144. If a second edge of the clock signal 122 arrive before a first edge of the reference clock signal 102, the FSM 165 enters the DOWN state, and assigns a negative sign for the phase error. In the DOWN state, the FSM 165 generates the enable signal 176 to latch the output value of the counter circuit 136 into the start value register 151, and generates the enable signal 174 to latch the output value of the counter circuit 136 into the stop value register 153. In some embodiments, in the DOWN state, the start value register 151 latches a first value of the counter circuit 136 when a second edge of the clock signal 122 arrives, and the stop value register 153 latches a second value of the counter circuit 136 when a corresponding first edge (e.g., a closest first edge) of the reference clock signal 102 arrives.

Figure 11:
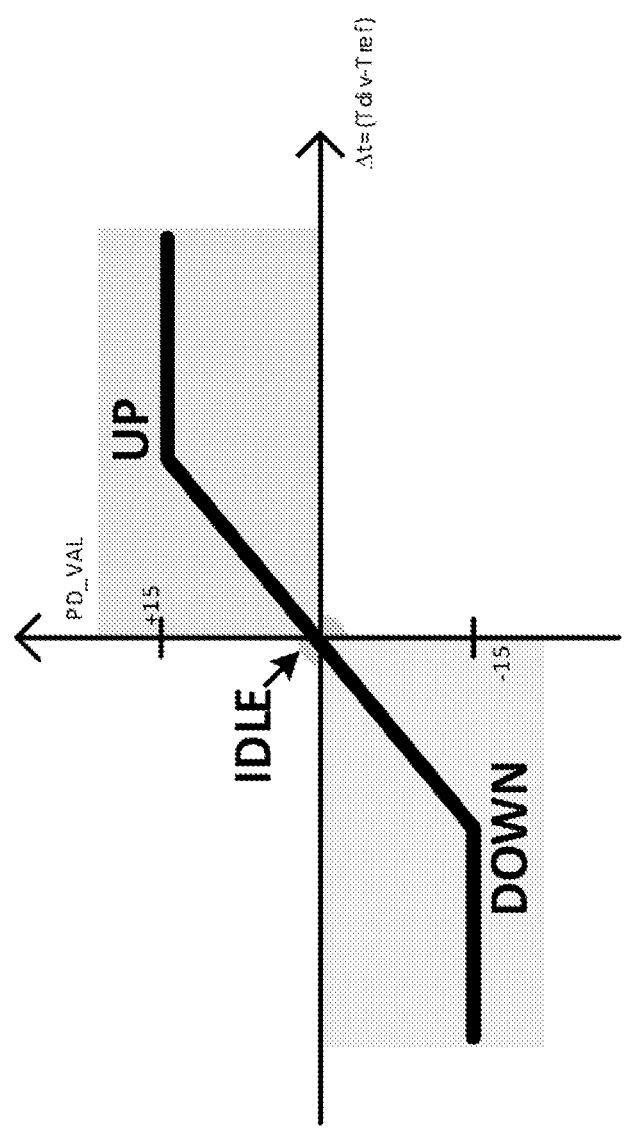
FIG. 11 illustrates the output of the coarse TDC of FIG. 10, in an embodiment.

FIG. 11 illustrates the output of the coarse TDC 500 of FIG. 10, in an embodiment. As illustrated in FIG. 11, when the coarse TDC 500 enters the UP state from the IDLE state, it outputs a positive phase error, and saturates the phase error when the phase error rises above a positive threshold. Similarly, when the coarse TDC 500 enters the DOWN state, it outputs a negative phase error, and saturates the phase error when the phase error is below a negative threshold.

Figure 12:
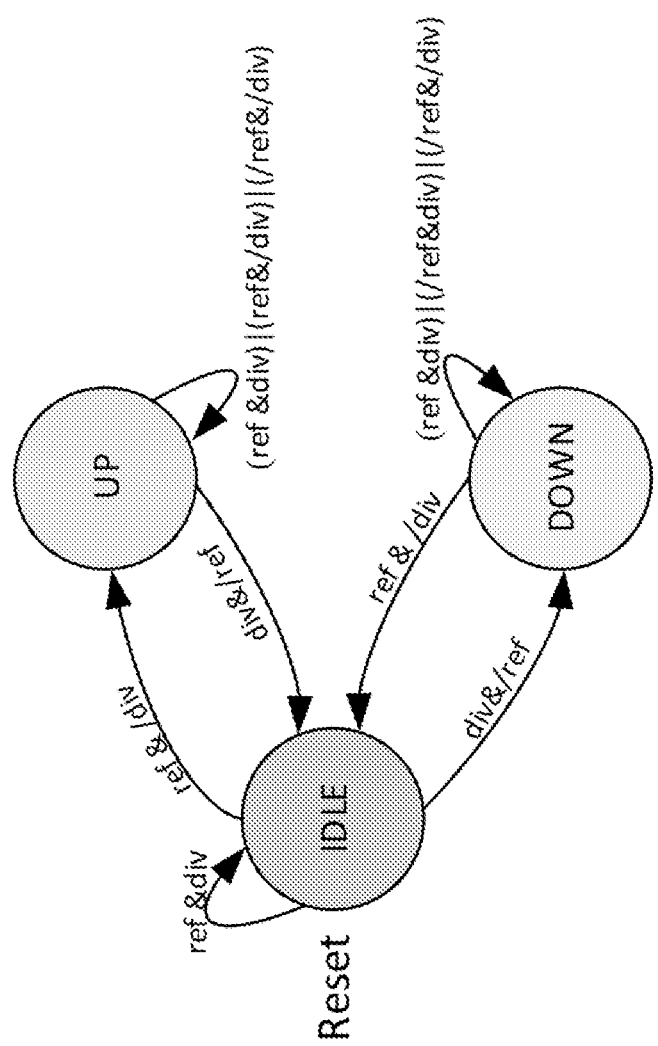
FIG. 12 illustrates the state transition of a finite-state machine (FSM) the coarse TDC of FIG. 10, in an embodiment.

FIG. 12 illustrates the state transition of the FSM 165 of the coarse TDC 500 of FIG. 10, in an embodiment. The FSM 165 transitions between three states: IDLE state, UP state, and DOWN state. FIG. 12 illustrates the transition paths and conditions for the state transitions. In FIG. 12, "ref" means arriving of the first edge of the reference clock signal 102 (e.g., 1 for first edge arriving and 0 otherwise), "div" means arriving of the corresponding second edge of the clock signal 122 (e.g., 1 for second edge arriving and 0 otherwise), and the notation "/" means logic NOT.

FIG. 13 illustrates the state transition table for the FSM 165 of the coarse TDC 500 of FIG. 10, in an embodiment. In the table of FIG. 13, the first four columns are the current state of the FSM, the current values for the "ref" signal and the "div" signal, and the difference value at the output of the subtractor circuit 155, respectively. The last five columns are the next state of the FSM, the enable signal 176 for the start value register 151, the enable signal 174 for the stop value register 153, the output enable signal 168, and the sign of the phase error, respectively.

Embodiments may achieve advantages as described below. The disclosed coarse TDC (e.g., 103 or 500), by detecting cycle slipping and/or saturating the calculated phase error, reduces or prevents the adverse effect of cycle slipping, thereby improving the robustness of the DPLL and achieving quick frequency lock over a wide frequency range during the acquisition mode. The coarse TDC is a digital circuit, which allows for low-area and low-power implementation of the DPLL in, e.g., integrated circuit (IC) devices. An all-digital DPLL design has the advantage of being less sensitive to process variation and temperature variation, thereby improving the performance of DPLL and avoiding the complex designs needed for process/temperature variation compensation. In addition, the disclosed coarse TDC (e.g., 103, 500) runs at a clock rate much lower than the DCO output signal frequency, e.g., using the clock signal 124. This reduces the power consumption of the DPLL significantly compared with a digital PLL with a coarse TDC that runs at the DCO output signal frequency. The two parallel feed-forward paths, which comprises the coarse TDC/coarse DLF and the fine TDC/fine DLF, respectively, allow for independent tuning for acquisition mode and tracking mode to achieve optimum DPLL performance.

Examples of the present invention are summarized here. Other examples can also be understood from the entirety of the specification and the claims filed herein.

Example 1. In an embodiment, a digital phase-locked loop (DPLL) circuit includes: a first time-to-digital converter (TDC) and a first digital loop filter (DLF) that are configured to be coupled between a reference clock source and a digitally controlled oscillator (DCO), wherein the first TDC is configured to, during an acquisition mode of the DPLL circuit, generate a phase error by: receiving a reference clock signal from the reference clock source; receiving a first clock signal that is based on an output of the DCO divided by a dividing factor; computing a phase error using the reference clock signal and the first clock signal; detecting cycle slipping in the computed phase error; and in response to detecting the cycle slipping, modifying the computed phase error to reduce the impact of cycle slipping on operation of the DPLL circuit; and a first frequency divider circuit coupled to the DCO, wherein the first frequency divider circuit is configured to generate the first clock signal by dividing the output of the DCO by the dividing factor.

Example 2. The DPLL circuit of Example 1, further comprising: a second TDC and a second DLF that are configured to be coupled between the reference clock source and the DCO, wherein a first loop bandwidth of the first DLF is wider than a second loop bandwidth of the second DLF.

Example 3. The DPLL circuit of Example 1, wherein the first TDC is configured to, during the acquisition mode of the DPLL circuit, send the computed phase error to the first DLF without modification when no cycle slipping is detected.

Example 4. The DPLL circuit of Example 1, further comprising a sigma-delta modulator (SDM) coupled to the first DLF and configured to convert a sum of a constant value and a first output of the first DLF into the dividing factor.

Example 5. The DPLL circuit of Example 4, wherein the first DLF is a proportional-integral (PI) filter comprising a proportional path and an integral path, wherein an output of the proportional path is the first output of the first DLF sent to the SDM, wherein an output of the integral path is sent to the DCO and used as a control word for the DCO.

Example 6. The DPLL circuit of Example 5, further comprising a second frequency divider circuit coupled between the DCO and the first TDC, wherein the second frequency divider circuit is configured to generate a second clock signal by dividing the output of the DCO by a fixed dividing factor and configured to send the second clock signal to the first TDC.

Example 7. The DPLL circuit of Example 6, wherein computing the phase error comprises: counting the number of clock cycles in the second clock signal using a counter circuit; detecting a first edge of the reference clock signal; detecting a second edge of the first clock signal, wherein the second edge is a closest edge to the first edge; and computing a first difference between a second output value of the counter circuit at the second edge of the first clock signal and a first output value of the counter circuit at the first edge of the reference clock signal.

Example 8. The DPLL circuit of Example 7, wherein computing the phase error further comprises: adding an offset to the computed first difference to compensate for a phase offset caused by different path delays of the reference clock signal and the first clock signal.

Example 9. The DPLL circuit of Example 8, wherein computing the phase error further comprises: after adding the offset, processing the computed first difference using a dead-zone function.

Example 10. The DPLL circuit of Example 7, wherein detecting cycle slipping comprises: computing a second difference between a current value of the phase error and a previous value of the phase error; determining if the second difference is within a range defined by a positive upper bound and a negative lower bound; and in response to determining that the second difference is outside the range, setting a flag signal for detection of cycle slipping.

Example 11. The DPLL circuit of Example 10, wherein modifying the computed phase error comprises: saturating the computed phase error to a positive saturation value if the second difference is lower than the negative lower bound; and saturating the computed phase error to a negative saturation value if the second difference is higher than the positive upper bound.

Example 12. In an embodiment, a digital phase-locked loop (DPLL) circuit includes: a coarse time-to-digital converter (TDC) and a coarse digital loop filter (DLF) that are configured to be coupled between a reference clock source and a digitally controlled oscillator (DCO), wherein the coarse TDC comprises: a first edge detection circuit configured to detect a first edge of a reference clock signal from the reference clock source; a second edge detection circuit configured to detect a second edge of a first clock signal, wherein the first clock signal is based on an output of the DCO divided by a dividing factor, wherein the second edge comprises a closest edge to the first edge; a counter configured to count the number of clock cycles of a second clock signal, wherein the second clock signal is the output of the DCO divided by a fixed dividing factor; a first register configured to latch a first output value of the counter at the first edge of the reference clock signal; a second register configured to latch a second output value of the counter at the second edge of the first clock signal; a subtractor circuit configured to compute a first difference between the second output value and the first output value of the counter; and a saturation circuit configured to detect cycle slipping between the reference clock signal and the first clock signal and configured to saturate the first difference to a pre-determined value when cycle slipping is detected. The DPLL circuit further includes a first frequency divider circuit coupled to the DCO, wherein the first frequency divider circuit is configured to generate the first clock signal by dividing the output of the DCO by the dividing factor; and a second frequency divider circuit coupled between the DCO and the coarse TDC, wherein the second frequency divider circuit is configured to generate the second clock signal by dividing the output of the DCO by the fixed dividing factor.

Example 13. The DPLL circuit of Example 12, further comprising: a fine TDC and a fine DLF that are configured to be coupled between the reference clock source and the DCO, wherein the coarse TDC and the coarse DLF are configured to generate phase errors for driving the DPLL circuit during an acquisition mode of the DPLL circuit, wherein the fine TDC and the fine DLF are configured to generate phase errors for driving the DPLL circuit during a tracking mode of DPLL circuit.

Example 14. The DPLL circuit of Example 12, wherein the first difference is used as a phase error of the DPLL circuit during an acquisition mode of the DPLL circuit, wherein the saturation circuit is configured to detect cycle slipping by: computing a second difference between a current value of the phase error and a previous value of the phase error; determining if the second difference is within a range defined by a positive upper bound and a negative lower bound; and in response to determining that the second difference is outside the range, setting a flag signal for detection of cycle slipping.

Example 15. In an embodiment, a digital phase-locked loop (DPLL) circuit includes: a coarse time-to-digital converter (TDC) and a coarse digital loop filter (DLF) that are configured to be coupled between a reference clock source and a digitally controlled oscillator (DCO), wherein the coarse TDC is configured to, during an acquisition mode of the DPLL circuit, generate a phase error by: receiving a reference clock signal from the reference clock source; receiving a first clock signal that is based on an output of the DCO divided by a dividing factor; computing a phase error using the reference clock signal and the first clock signal; comparing a magnitude of the phase error with a threshold value; and in response to detecting that the magnitude of the phase error is equal to or larger than the threshold value, saturating the magnitude of the computed phase error to the threshold value. The DPLL circuit further includes a first frequency divider circuit coupled to the DCO, wherein the first frequency divider circuit is configured to generate the first clock signal by dividing the output of the DCO by the dividing factor.

Example 16. The DPLL circuit of Example 15, further comprising a sigma-delta modulator (SDM) coupled to the coarse DLF and configured to convert a sum of a constant value and a first output of the coarse DLF into the dividing factor, wherein the dividing factor is timing-varying.

Example 17. The DPLL circuit of Example 15, further comprising a second frequency divider circuit coupled between the DCO and the coarse TDC, wherein the second frequency divider circuit is configured to generate a second clock signal by dividing the output of the DCO by a fixed dividing factor.

Example 18. The DPLL circuit of Example 17, wherein computing the phase error comprises: counting the number of clock cycles in the second clock signal using a counter, detecting a first edge of the reference clock signal; detecting a second edge of the first clock signal, wherein the second edge comprises a closest edge of the first clock signal to the first edge; and computing a time delay between the first edge and the second edge using a first output value of the counter at the first edge and a second output value of the counter at the second edge, wherein an absolute value of the time delay is used as the magnitude of the phase error.

Example 19. The DPLL circuit of Example 18, wherein the coarse TDC comprises a finite-state machine (FSM), wherein the FSM is configured to determine a sign of the phase error based on whether the first edge precedes the second edge.

Example 20. The DPLL circuit of Example 19, wherein the FSM is configured to: assign a positive sign for the phase error if the first edge precedes the second edge; and assign a negative sign for the phase error if the second edge precedes the first edge.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A digital phase-locked loop (DPLL) circuit comprising:
   a first time-to-digital converter (TDC) and a first digital loop filter (DLF) that are configured to be coupled between a reference clock source and a digitally controlled oscillator (DCO), wherein the first TDC is configured to, during an acquisition mode of the DPLL circuit, generate a phase error by:
   receiving a reference clock signal from the reference clock source;
   receiving a first clock signal that is based on an output of the DCO divided by a dividing factor;
   computing a phase error using the reference clock signal and the first clock signal;
   detecting cycle slipping in the computed phase error; and
   in response to detecting the cycle slipping, modifying the computed phase error to reduce the impact of cycle slipping on operation of the DPLL circuit; and
   a first frequency divider circuit coupled to the DCO, wherein the first frequency divider circuit is configured to generate the first clock signal by dividing the output of the DCO by the dividing factor.

2. The DPLL circuit of claim 1, further comprising:
   a second TDC and a second DLF that are configured to be coupled between the reference clock source and the DCO, wherein a first loop bandwidth of the first DLF is wider than a second loop bandwidth of the second DLF.

3. The DPLL circuit of claim 1, wherein the first TDC is configured to, during the acquisition mode of the DPLL circuit, send the computed phase error to the first DLF without modification when no cycle slipping is detected.

4. The DPLL circuit of claim 1, further comprising a sigma-delta modulator (SDM) coupled to the first DLF and configured to convert a sum of a constant value and a first output of the first DLF into the dividing factor.

5. The DPLL circuit of claim 4, wherein the first DLF is a proportional-integral (PI) filter comprising a proportional path and an integral path, wherein an output of the proportional path is the first output of the first DLF sent to the SDM, wherein an output of the integral path is sent to the DCO and used as a control word for the DCO.

6. The DPLL circuit of claim 5, further comprising a second frequency divider circuit coupled between the DCO and the first TDC, wherein the second frequency divider circuit is configured to generate a second clock signal by dividing the output of the DCO by a fixed dividing factor and configured to send the second clock signal to the first TDC.

7. The DPLL circuit of claim 6, wherein computing the phase error comprises:
   counting the number of clock cycles in the second clock signal using a counter circuit;
   detecting a first edge of the reference clock signal;
   detecting a second edge of the first clock signal, wherein the second edge is a closest edge to the first edge; and
   computing a first difference between a second output value of the counter circuit at the second edge of the first clock signal and a first output value of the counter circuit at the first edge of the reference clock signal.

8. The DPLL circuit of claim 7, wherein computing the phase error further comprises:
   adding an offset to the computed first difference to compensate for a phase offset caused by different path delays of the reference clock signal and the first clock signal.

9. The DPLL circuit of claim 8, wherein computing the phase error further comprises:
   after adding the offset, processing the computed first difference using a dead-zone function.

10. The DPLL circuit of claim 7, wherein detecting cycle slipping comprises:
    computing a second difference between a current value of the phase error and a previous value of the phase error;
    determining if the second difference is within a range defined by a positive upper bound and a negative lower bound; and
    in response to determining that the second difference is outside the range, setting a flag signal for detection of cycle slipping.

11. The DPLL circuit of claim 10, wherein modifying the computed phase error comprises:
saturating the computed phase error to a positive saturation value if the second difference is lower than the negative lower bound; and
saturating the computed phase error to a negative saturation value if the second difference is higher than the positive upper bound.

12. A digital phase-locked loop (DPLL) circuit comprising:
a coarse time-to-digital converter (TDC) and a coarse digital loop filter (DLF) that are configured to be coupled between a reference clock source and a digitally controlled oscillator (DCO), wherein the coarse TDC comprises:
a first edge detection circuit configured to detect a first edge of a reference clock signal from the reference clock source;
a second edge detection circuit configured to detect a second edge of a first clock signal, wherein the first clock signal is based on an output of the DCO divided by a dividing factor, wherein the second edge comprises a closest edge to the first edge;
a counter configured to count the number of clock cycles of a second clock signal, wherein the second clock signal is the output of the DCO divided by a fixed dividing factor;
a first register configured to latch a first output value of the counter at the first edge of the reference clock signal;
a second register configured to latch a second output value of the counter at the second edge of the first clock signal;
a subtractor circuit configured to compute a first difference between the second output value and the first output value of the counter, and
a saturation circuit configured to detect cycle slipping between the reference clock signal and the first clock signal and configured to saturate the first difference to a pre-determined value when cycle slipping is detected;
a first frequency divider circuit coupled to the DCO, wherein the first frequency divider circuit is configured to generate the first clock signal by dividing the output of the DCO by the dividing factor; and
a second frequency divider circuit coupled between the DCO and the coarse TDC, wherein the second frequency divider circuit is configured to generate the second clock signal by dividing the output of the DCO by the fixed dividing factor.

13. The DPLL circuit of claim 12, further comprising:
a fine TDC and a fine DLF that are configured to be coupled between the reference clock source and the DCO, wherein the coarse TDC and the coarse DLF are configured to generate phase errors for driving the DPLL circuit during an acquisition mode of the DPLL circuit, wherein the fine TDC and the fine DLF are configured to generate phase errors for driving the DPLL circuit during a tracking mode of DPLL circuit.

14. The DPLL circuit of claim 12, wherein the first difference is used as a phase error of the DPLL circuit during an acquisition mode of the DPLL circuit, wherein the saturation circuit is configured to detect cycle slipping by:
computing a second difference between a current value of the phase error and a previous value of the phase error;
determining if the second difference is within a range defined by a positive upper bound and a negative lower bound; and
in response to determining that the second difference is outside the range, setting a flag signal for detection of cycle slipping.

15. A digital phase-locked loop (DPLL) circuit comprising:
a coarse time-to-digital converter (TDC) and a coarse digital loop filter (DLF) that are configured to be coupled between a reference clock source and a digitally controlled oscillator (DCO), wherein the coarse TDC is configured to, during an acquisition mode of the DPLL circuit, generate a phase error by:
receiving a reference clock signal from the reference clock source;
receiving a first clock signal that is based on an output of the DCO divided by a dividing factor;
computing a phase error using the reference clock signal and the first clock signal;
comparing a magnitude of the phase error with a threshold value; and
in response to detecting that the magnitude of the phase error is equal to or larger than the threshold value, saturating the magnitude of the computed phase error to the threshold value; and
a first frequency divider circuit coupled to the DCO, wherein the first frequency divider circuit is configured to generate the first clock signal by dividing the output of the DCO by the dividing factor.

16. The DPLL circuit of claim 15, further comprising a sigma-delta modulator (SDM) coupled to the coarse DLF and configured to convert a sum of a constant value and a first output of the coarse DLF into the dividing factor, wherein the dividing factor is timing-varying.

17. The DPLL circuit of claim 15, further comprising a second frequency divider circuit coupled between the DCO and the coarse TDC, wherein the second frequency divider circuit is configured to generate a second clock signal by dividing the output of the DCO by a fixed dividing factor.

18. The DPLL circuit of claim 17, wherein computing the phase error comprises:
counting the number of clock cycles in the second clock signal using a counter;
detecting a first edge of the reference clock signal;
detecting a second edge of the first clock signal, wherein the second edge comprises a closest edge of the first clock signal to the first edge; and
computing a time delay between the first edge and the second edge using a first output value of the counter at the first edge and a second output value of the counter at the second edge, wherein an absolute value of the time delay is used as the magnitude of the phase error.

19. The DPLL circuit of claim 18, wherein the coarse TDC comprises a finite-state machine (FSM), wherein the FSM is configured to determine a sign of the phase error based on whether the first edge precedes the second edge.

20. The DPLL circuit of claim 19, wherein the FSM is configured to:
assign a positive sign for the phase error if the first edge precedes the second edge; and
assign a negative sign for the phase error if the second edge precedes the first edge.

* * * * *